United States Patent
Morishima et al.

(10) Patent No.: US 10,600,621 B2
(45) Date of Patent: Mar. 24, 2020

(54) PLASMA ELECTRODE AND PLASMA PROCESSING DEVICE

(71) Applicant: TOKYO ELECTRON LIMITED, Tokyo (JP)

(72) Inventors: Masato Morishima, Tokyo (JP); Katsuhiko Iwabuchi, Nirasaki (JP); Takashi Fuse, Nirasaki (JP); Madoka Fujimoto, Koshi (JP); Daisuke Nishide, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/087,249

(22) PCT Filed: Mar. 7, 2017

(86) PCT No.: PCT/JP2017/008928
§ 371 (c)(1),
(2) Date: Sep. 21, 2018

(87) PCT Pub. No.: WO2017/169556
PCT Pub. Date: Oct. 5, 2017

(65) Prior Publication Data
US 2019/0108984 A1 Apr. 11, 2019

(30) Foreign Application Priority Data
Mar. 30, 2016 (JP) .................................. 2016-066989

(51) Int. Cl.
*H01J 37/32* (2006.01)
*C03C 17/42* (2006.01)
(Continued)

(52) U.S. Cl.
CPC ........ *H01J 37/32532* (2013.01); *C03C 17/42* (2013.01); *C23C 16/509* (2013.01);
(Continued)

(58) Field of Classification Search
None
See application file for complete search history.

(56) References Cited

U.S. PATENT DOCUMENTS

| | | | | |
|---|---|---|---|---|
| 7,712,434 | B2 * | 5/2010 | Dhindsa | H01J 37/32009 118/723 E |
| 7,886,687 | B2 * | 2/2011 | Lee | H01J 37/3244 118/723 E |

(Continued)

FOREIGN PATENT DOCUMENTS

| | | |
|---|---|---|
| JP | 2004-259663 A | 9/2004 |
| JP | 2006-237490 A | 9/2006 |

(Continued)

*Primary Examiner* — Alexander H Taningco
*Assistant Examiner* — Srinivas Sathiraju
(74) *Attorney, Agent, or Firm* — Nath, Goldberg & Meyer; Jerald L. Meyer

(57) ABSTRACT

A plasma electrode is provided with an electrode plate, a ground plate, and an insulating plate arranged between the electrode plate and the ground plate. Protrusions of the electrode plate are arranged inside through holes of the ground plate and inside through holes of the insulating plate. One of the through hole provided on the center axes of the protrusions and the through hole provided around the through hole discharges a first processing gas to below the ground plate. The other of the through holes exhausts a gas existing below the ground plate. A second flow path around the protrusions supplies a second processing gas supplied via a first flow path to a gap between outer walls of the protrusions and inner walls of the through holes. The second processing gas supplied to the gap is converted into plasma by high frequency power applied to the electrode plate.

10 Claims, 18 Drawing Sheets

(51) Int. Cl.
*C23C 16/509* (2006.01)
*H05H 1/46* (2006.01)

(52) U.S. Cl.
CPC ......... *H01J 37/32009* (2013.01); *H05H 1/46* (2013.01); *C03C 2218/152* (2013.01); *H05H 2001/466* (2013.01)

(56) References Cited

U.S. PATENT DOCUMENTS

| | | | | |
|---|---|---|---|---|
| 8,191,505 B2* | 6/2012 | Kamaishi | ............ | H01J 37/3244 118/715 |
| 8,287,967 B2* | 10/2012 | Nishikawa | ........ | H01L 21/67017 134/19 |
| 8,858,754 B2* | 10/2014 | Horiguchi | ........... | H01J 37/3244 118/723 E |
| 9,165,780 B2* | 10/2015 | Shimizu | ............ | C23C 16/45536 |
| 9,252,001 B2* | 2/2016 | Sawada | ............ | H01J 37/32091 |
| 9,623,503 B2* | 4/2017 | Lee | ....................... | B23K 1/0016 |
| 9,926,624 B2* | 3/2018 | Yamada | ................ | C23C 16/345 |
| 2001/0021414 A1 | 9/2001 | Morishima | ......... | C23C 16/4404 427/248.1 |
| 2005/0257747 A1* | 11/2005 | Wakabayashi | ...... | C23C 16/4581 118/728 |
| 2009/0260762 A1* | 10/2009 | Kamaishi | ............ | H01J 37/3244 156/345.33 |
| 2010/0206846 A1* | 8/2010 | Nishimura | ........ | C23C 16/45565 216/67 |
| 2011/0162802 A1* | 7/2011 | Okumura | ........... | H01J 37/32009 156/345.44 |
| 2011/0308460 A1* | 12/2011 | Hong | ..................... | C23C 16/045 118/723 E |
| 2012/0247390 A1* | 10/2012 | Sawada | ............... | C23C 16/4412 118/723 AN |
| 2014/0007812 A1* | 1/2014 | Chang | ............... | H01J 37/32568 118/723 E |
| 2014/0138356 A1* | 5/2014 | Sawada | ............. | H01J 37/32091 216/67 |
| 2014/0151332 A1* | 6/2014 | Fukasawa | ........... | H01L 21/6875 216/67 |
| 2014/0291286 A1* | 10/2014 | Okayama | ............ | H01J 37/3244 216/37 |
| 2014/0311676 A1* | 10/2014 | Hatoh | ............... | H01L 21/68721 156/345.51 |
| 2014/0373783 A1* | 12/2014 | Sawada | ............... | H01L 31/1824 118/723 R |
| 2015/0053135 A1* | 2/2015 | Chung | ............. | H01J 37/32091 118/723 E |
| 2015/0303037 A1 | 10/2015 | Ha et al. | | |
| 2015/0368802 A1* | 12/2015 | Yamada | ................ | C23C 16/345 427/579 |
| 2016/0168706 A1* | 6/2016 | Seo | ........................ | C23C 16/505 156/345.34 |
| 2017/0301518 A1* | 10/2017 | Hosaka | ...................... | F16K 3/08 |

FOREIGN PATENT DOCUMENTS

| | | |
|---|---|---|
| JP | 2007-173848 A | 7/2007 |
| JP | 2008-75182 A | 4/2008 |

* cited by examiner

FIG. 5
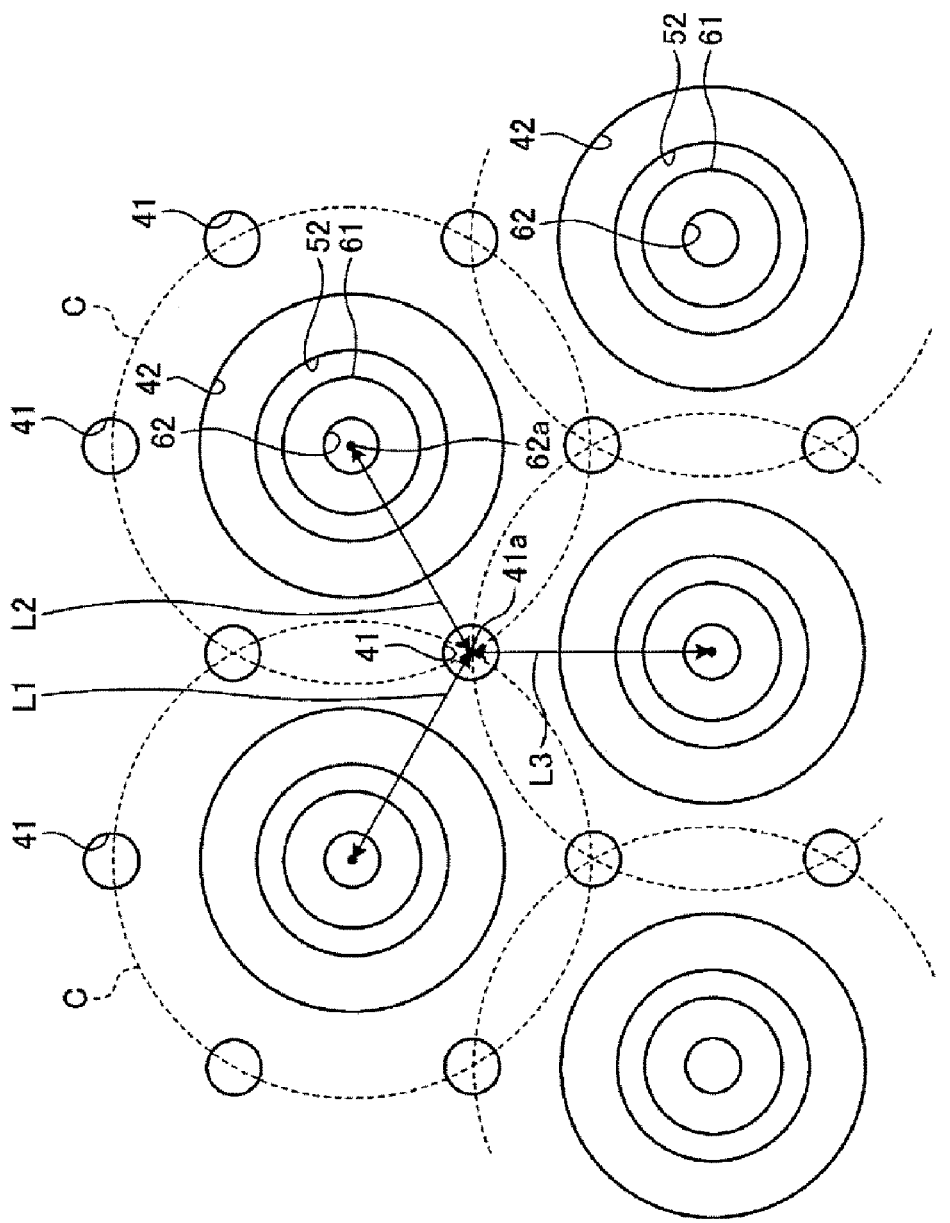
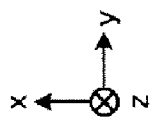

PLASMA ELECTRODE AND PLASMA PROCESSING DEVICE

TECHNICAL FIELD

Various aspects and embodiments of the present disclosure relate to a plasma electrode and a plasma processing device.

BACKGROUND

Since strengthened glass used for displays of portable information equipment and the like is weak against scratches, a surface of the strengthened glass is coated with an antifouling film. However, adhesion between the strengthened glass and the antifouling film is poor. Therefore, in order to improve the adhesion between the antifouling film and the strengthened glass, a base film such as a $SiO_2$ film or the like is formed on the strengthened glass, and the antifouling film is formed on the base film. The $SiO_2$ film can be formed on the strengthened glass by using, for example, a plasma CVD (Chemical Vapor Deposition) device which makes use of ICP (Inductively Coupled Plasma) or the like.

PRIOR ART DOCUMENTS

Patent Documents

Patent Document 1: Japanese laid-open publication No. 2008-75182

By the way, in the case of a touch panel display, an antifouling film is easily peeled off due to physical damage such as rubbing or the like. Therefore, the antifouling film needs to be improved in durability against physical damage.

SUMMARY

According to one aspect of the present disclosure, there is provided a plasma electrode including a first electrode plate having a plurality of cylindrical protrusions and to which high frequency power is applied, a ground plate provided with a plurality of cylindrical first through holes having an inner diameter larger than an outer diameter of the protrusions, and an insulating plate provided with a plurality of cylindrical second through holes having an inner diameter larger than the outer diameter of the protrusions and disposed between the first electrode plate and the ground plate. The first electrode plate, the insulating plate, and the ground plate are overlappingly arranged so that the protrusions are arranged inside the first through holes and the second through holes. A third through hole is provided in each of the protrusions along a center axis of each of the protrusions. A first flow path is provided between the first electrode plate and the insulating plate. A second flow path communicating with the first flow path is provided around the protrusions. A fourth through hole is provided in the ground plate around each of the first through holes. One of the third through hole and the fourth through hole discharges a first processing gas to below the ground plate. The other of the third through hole and the fourth through hole exhausts a gas existing below the ground plate. The second flow path communicates with a gap formed between outer walls of the protrusions and inner walls of the first through holes, and supplies a second processing gas supplied via the first flow path to the gap. The second processing gas supplied to the gap is converted into plasma in the gap by the high frequency power applied to the first electrode plate.

According to various aspects and embodiments of the present disclosure, it is possible to form a more flexible and supple base film. This makes it possible to improve the durability against physical damage of an antifouling film formed on the base film.

BRIEF DESCRIPTION OF DRAWINGS

FIG. 5 is an enlarged view showing an example of the lower surface of the plasma electrode.

DETAILED DESCRIPTION

Figure 1:
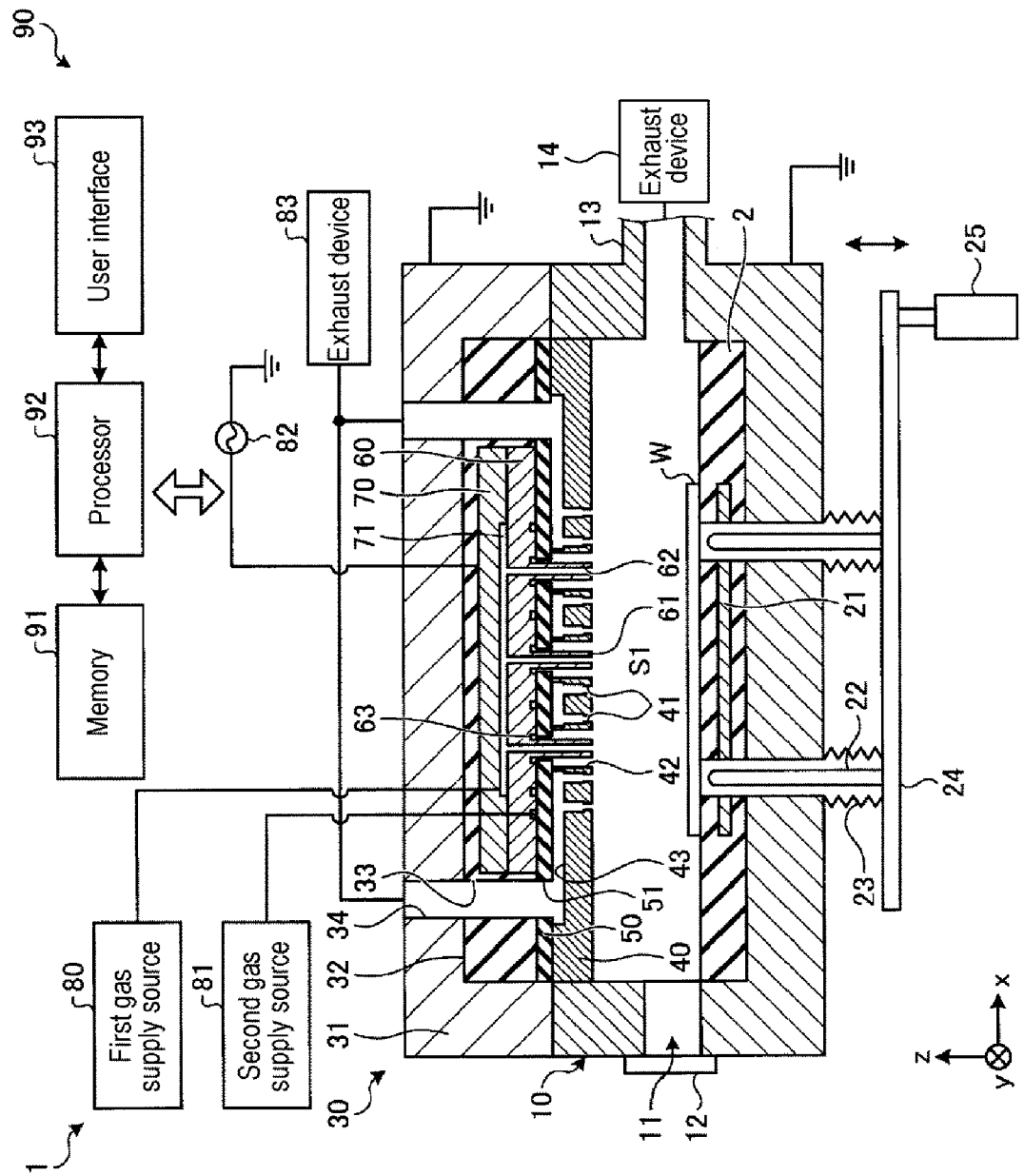
FIG. 1 is a sectional view showing an example of a plasma processing device according to a first embodiment.

In one embodiment, a plasma electrode disclosed herein includes a first electrode plate having a plurality of cylindrical protrusions and to which high frequency power is applied, a ground plate provided with a plurality of cylindrical first through holes having an inner diameter larger than an outer diameter of the protrusions, and an insulating plate provided with a plurality of cylindrical second through holes having an inner diameter larger than the outer diameter of the protrusions and disposed between the first electrode plate and the ground plate. The first electrode plate, the insulating plate, and the ground plate are overlappingly arranged so that the protrusions are arranged inside the first through holes and the second through holes. A third through hole is provided in each of the protrusions along a center axis of each of the protrusions. A first flow path is provided between the first electrode plate and the insulating plate. A second flow path communicating with the first flow path is provided around the protrusions. A fourth through hole is provided in the ground plate around each of the first through holes. One of the third through hole and the fourth through hole discharges a first processing gas to below the ground plate. The other of the third through hole and the fourth through hole exhausts a gas existing below the ground plate. The second flow path communicates with a gap formed between outer walls of the protrusions and inner walls of the first through holes, and supplies a second processing gas supplied via the first flow path to the gap. The second processing gas supplied to the gap is converted into plasma in the gap by the high frequency power applied to the first electrode plate.

In one embodiment of the plasma electrode disclosed herein, the first electrode plate, the insulating plate, and the ground plate may be overlappingly arranged such that a center axis of each of the protrusions of the first electrode plate, a center axis of each of the first through holes, and a center axis of each of the second through holes are aligned with one another.

In one embodiment of the plasma electrode disclosed herein, the second flow path may be a gap formed between the outer walls of the protrusions and inner walls of the second through holes.

In one embodiment of the disclosed plasma electrode, the first flow path may be provided around each of the protrusions on a surface of the first electrode plate on which the protrusions are provided, and the second flow path may be narrower in width than the first flow path provided around the protrusions.

In one embodiment of the plasma electrode disclosed herein, the second flow path may be a plurality of fifth through holes provided around the protrusions.

In one embodiment of the plasma electrode disclosed herein, the first flow path may be provided around the protrusions on a surface of the first electrode plate on which the protrusions are provided, and an inner diameter of an opening of each of the fifth through holes may be narrower than a width of the first flow path provided around the protrusions.

In one embodiment, the plasma electrode disclosed herein may further include a second electrode plate provided on a surface of the first electrode plate opposite to a surface of the first electrode plate facing the insulating plate. In addition, a third flow path communicating with the third through hole may be provided between the first electrode plate and the second electrode plate.

In one embodiment of the plasma electrode disclosed herein, the first flow path may extend in a first direction in a plane parallel to a lower surface of the first electrode plate, and the third flow path may extend in a second direction differing from the first direction in the plane parallel to the lower surface of the first electrode plate. In addition, the extension direction of the first flow path and the extension direction of the third flow path may intersect at a center axis of the third through hole when projected onto the plane parallel to the lower surface of the first electrode plate.

In one embodiment of the plasma electrode disclosed herein, the first electrode plate or the second electrode plate may be provided with a first groove serving as the third flow path, and the first electrode plate and the second electrode plate may be in contact with each other on a surface other than the first groove.

In one embodiment of the plasma electrode disclosed herein, the third through hole may discharge the first processing gas to below the ground plate, and the fourth through hole may exhaust a gas existing below the ground plate. In addition, the fourth through hole may have a center axis arranged at a position equidistant from center axes of three adjacent third through holes in the ground plate.

In one embodiment, the plasma processing device disclosed herein includes a chamber, a mounting table, and a plasma electrode. The mounting table is disposed in the chamber and is configured to hold a substrate to be processed. The plasma electrode includes a first electrode plate having a plurality of cylindrical protrusions and to which high frequency power is applied, a ground plate provided with a plurality of cylindrical first through holes having an inner diameter larger than an outer diameter of the protrusions, and an insulating plate provided with a plurality of cylindrical second through holes having an inner diameter larger than the outer diameter of the protrusions and disposed between the first electrode plate and the ground plate. The first electrode plate, the insulating plate, and the ground plate are overlappingly arranged so that the protrusions are arranged inside the first through holes and the second through holes. A third through hole is provided in each of the protrusions along a center axis of each of the protrusions. A first flow path is provided between the first electrode plate and the insulating plate. A second flow path communicating with the first flow path is provided around the protrusions. In the ground plate, a fourth through hole is provided around each of the first through holes. One of the third through hole and the fourth through hole discharges a first processing gas to below the ground plate. The other of the third through hole and the fourth through hole exhausts a gas existing below the ground plate. The second flow path communicates with a gap formed between outer walls of the protrusions and inner walls of the first through holes, and supplies a second processing gas to the gap via the first flow path. The second processing gas supplied to the gap is converted into plasma in the gap by the high frequency power applied to the first electrode plate.

Hereinafter, embodiments of a plasma electrode and a plasma processing device disclosed herein will be described in detail with reference to the drawings. It should be noted that the plasma electrode and the plasma processing device disclosed herein are not limited by the following embodiments.

First Embodiment

[Configuration of Plasma Processing Device 1]

FIG. 1 is a sectional view showing an example of a plasma processing device 1 according to a first embodiment. As shown in FIG. 1, for example, the plasma processing device 1 includes a chamber 10, a mounting table 2, and a plasma electrode 30. The plasma processing device 1 according to the present embodiment is a device for forming a base film (hereinafter referred to as a primer layer in some cases) that serves as a base of an antifouling film on a substrate W. In FIG. 1, the +z direction on the z axis is defined as upward, and the −z direction is defined as downward. Further, in FIG. 1, a plane parallel to the surface of the substrate W loaded into the chamber 10 is defined as an xy plane. In the respective drawings described below, the x axis, the y axis, and the z axis are indicated as necessary. The x axis, the y axis, and the z axis in the respective drawings correspond to the x axis, the y axis, and z axis, shown in FIG. 1.

The chamber 10 is made of metal such as aluminum or stainless steel and has a cylindrical shape with its bottom closed. The upper end portion of the side wall of the chamber 10 forms an opening. The chamber 10 is grounded. An opening 11 for loading and unloading the substrate W is provided on the side wall of the chamber 10. A gate valve 12 for opening and closing the opening 11 is provided at the opening 11. In the present embodiment, the substrate W is, for example, chemically strengthened glass.

An exhaust pipe 13 is provided on the side wall of the chamber 10. An exhaust device 14 having a vacuum pump such as a turbo molecular pump or the like is connected to the downstream side of the exhaust pipe 13. The exhaust device 14 reduces the pressure in the chamber 10 to a predetermined degree of vacuum. The exhaust device 14 operates before execution of a process for forming a base film on the substrate W, and reduces the pressure in the chamber 10 to the predetermined degree of vacuum. While the process for forming the base film on the substrate W is being executed, the exhaust device 14 stops the exhaust operation, and a gas in the chamber 10 is exhausted by an exhaust device 83 described later.

Inside the chamber 10, the mounting table 2 is provided. On the mounting table 2, the substrate W to be subjected to plasma processing is mounted. Delivery of the substrate W between a transfer mechanism outside the chamber 10 and the mounting table 2 is performed by using lift pins 22. The lift pins 22 are configured to be movable up and down by an elevating mechanism 25 via an elevator plate 24. The periphery of each of the lift pins 22 is covered with a bellows 23.

In the mounting table 2, a temperature adjustment part 21 formed of a heat dissipation element, for example, a resistor or the like, is provided. The temperature adjustment part 21 generates heat using electric power supplied from a power supply part (not shown), and heats the substrate W via the upper surface of the mounting table 2 to adjust the temperature of the substrate W to fall within a predetermined temperature range. In the example of FIG. 1, the temperature adjustment part 21 heats the substrate W. As another example, the temperature adjustment part 21 may heat or cool the substrate W according to process conditions, thereby adjusting the temperature of the substrate W to fall within the predetermined temperature range. In this case, for example, a Peltier element or the like may be adopted as the temperature adjustment part 21.

The plasma electrode 30 is attached to the upper portion of the chamber 10 so as to face the mounting table 2. The opening at the upper end portion of the side wall of the chamber 10 is closed by the plasma electrode 30. For example, an O ring is disposed between the plasma electrode 30 and the upper end portion of the side wall of the chamber 10. The side wall of the plasma electrode 30 is grounded. Hereinafter, a space between the plasma electrode 30 and the substrate W mounted on the mounting table 2 will be referred to as a first space S1.

Figure 2:
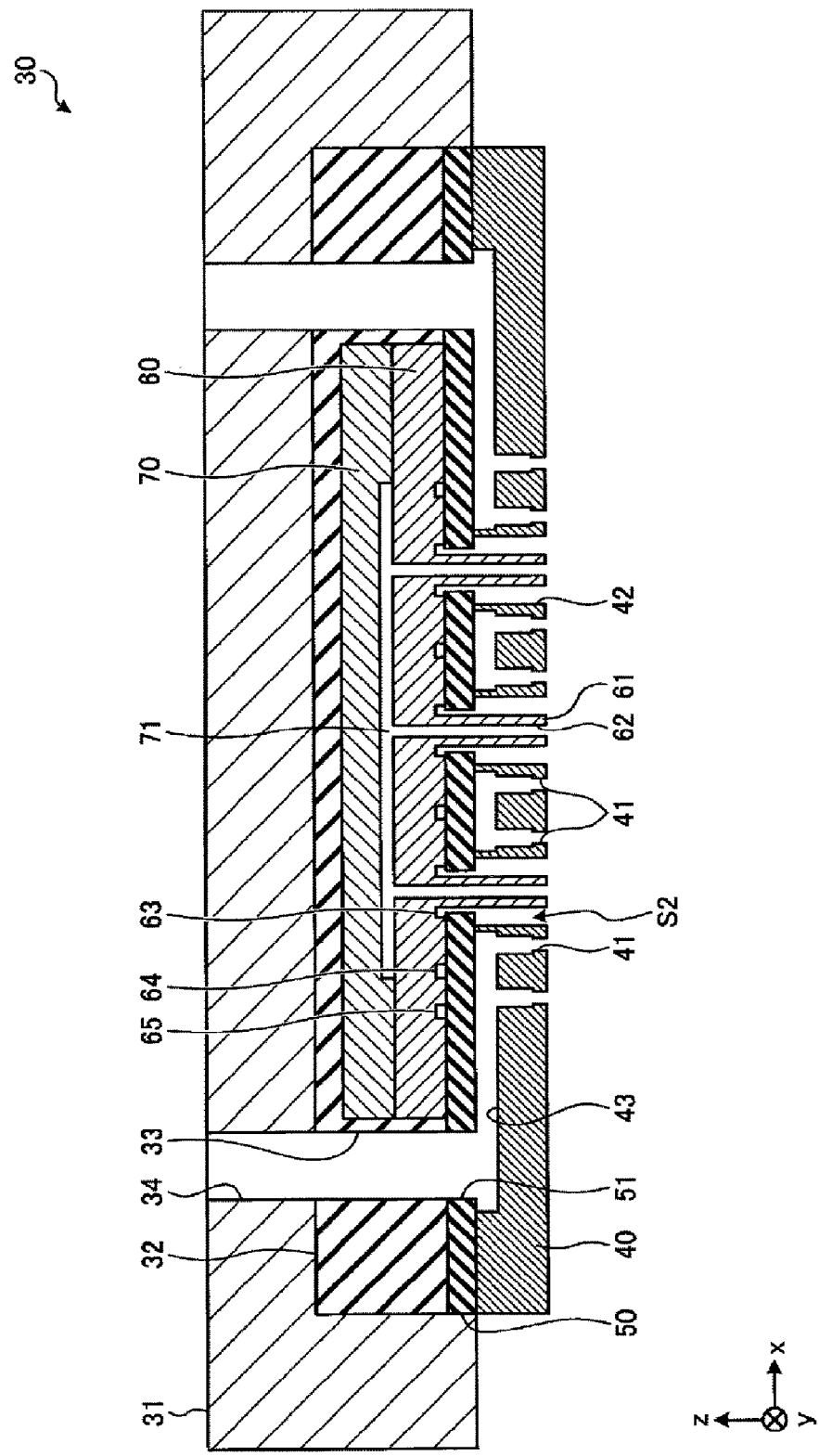
FIG. 2 is a sectional view showing an example of a plasma electrode.
Figure 3:
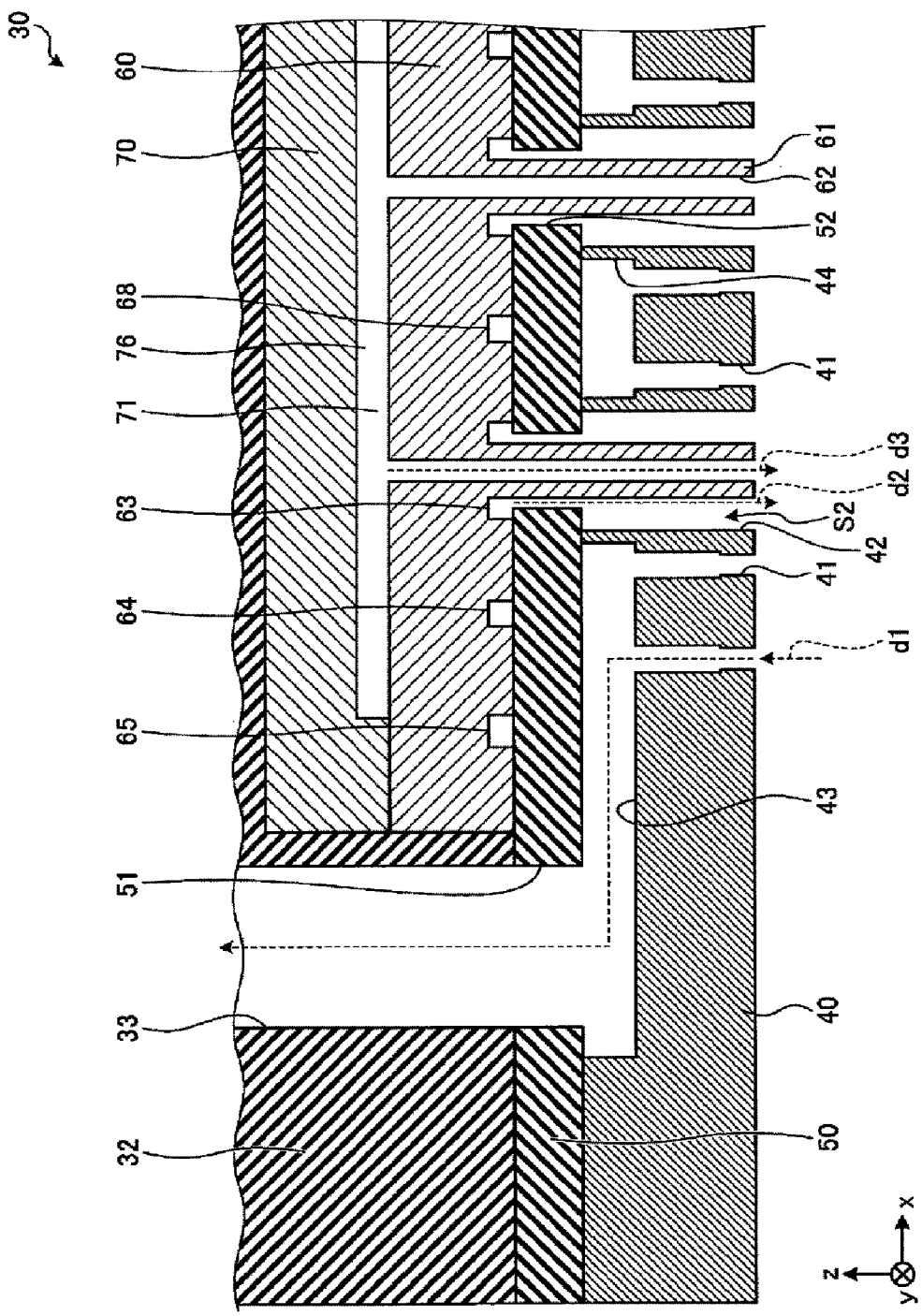
FIG. 3 is an enlarged sectional view showing an example of the plasma electrode.
Figure 4:
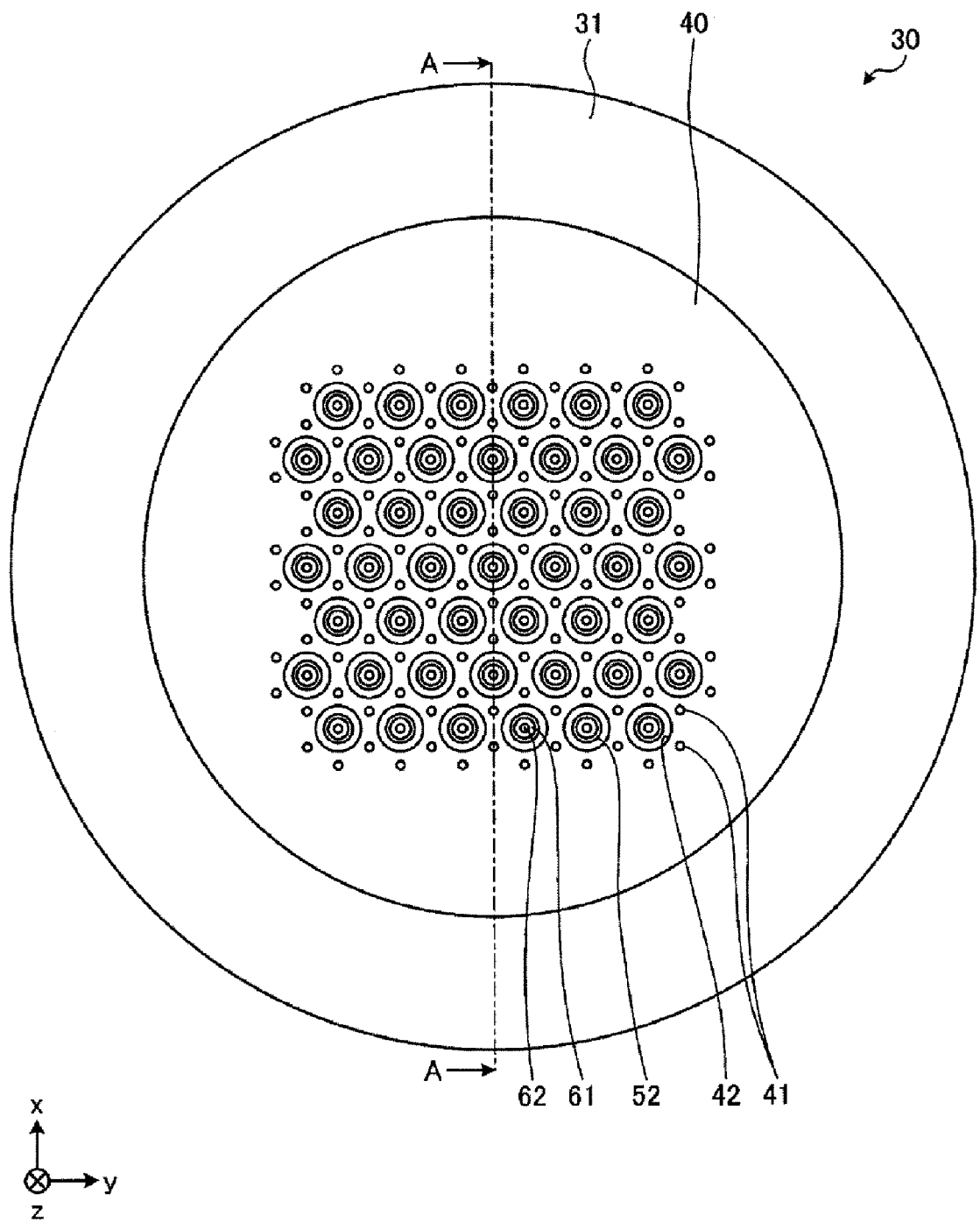
FIG. 4 is a view showing an example of a lower surface of the plasma electrode.

Now, the description of the plasma electrode 30 will be continued further with reference to FIGS. 2 to 4. FIG. 2 is a sectional view showing an example of the plasma electrode 30. FIG. 3 is an enlarged sectional view showing an example of the plasma electrode 30. FIG. 4 is a view showing an example of the lower surface of the plasma electrode 30. The cross section A-A of the plasma electrode 30 shown in FIG. 4 corresponds to the sectional view of the plasma electrode 30 shown in FIG. 2. For example, as shown in FIGS. 1 to 4, the plasma electrode 30 includes a housing 31, an upper insulating plate 32, a ground plate 40, an intermediate insulating plate 50, an intermediate electrode plate 60, and an upper electrode plate 70.

The ground plate 40 is formed in a substantially disk-like shape by a conductive material such as metal and is provided in the lower portion of the plasma electrode 30. The ground plate 40 is grounded via a side wall or the like of the chamber 10. The ground plate 40 is provided with a plurality of through holes 41 and a plurality of through holes 42, which penetrate the ground plate 40 in the thickness direction of the ground plate 40 and have substantially cylindrical inner walls. A recess 43 is formed on the upper surface of the ground plate 40, and the plurality of through holes 41 communicates with the recess 43. On the upper surface of the ground plate 40, for example, as shown in FIG. 3, a substantially cylindrical rib 44 having an inner circumferential surface continuous with the inner circumferential surface of each of the through holes 42 is provided for each of the through holes 42. In the case where the intermediate insulating plate 50 and the ground plate 40 are configured as the plasma electrode 30, the upper end of the rib 44 is in contact with the lower surface of the intermediate insulating plate 50. Thus, the space formed by the recess 43 and the lower surface of the intermediate insulating plate 50 is separated from the space in each of the through holes 42 by the rib 44. Each of the through holes 41 is an example of a fourth through hole, and each of the through holes 42 is an example of a first through hole.

The intermediate insulating plate 50 is formed, for example, in a substantially disk-like shape by an insulating material, for example, alumina ($Al_2O_3$) or the like. The intermediate insulating plate 50 is disposed between the ground plate 40 and the intermediate electrode plate 60 provided above the ground plate 40, thereby insulating the ground plate 40 from the intermediate electrode plate 60. The intermediate insulating plate 50 is provided with a plurality of through holes 51 penetrating the intermediate insulating plate 50 in the thickness direction of the intermediate insulating plate 50 and having substantially cylindrical inner walls. Each of the through holes 51 communicates with the space formed by the recess 43 of the ground plate 40 and the lower surface of the intermediate insulating plate 50.

As shown in FIG. 3, the intermediate insulating plate 50 is provided with a plurality of through holes 52 penetrating the intermediate insulating plate 50 in the thickness direction thereof and having substantially cylindrical inner walls. Each of the through holes 52 is an example of a second through hole. The inner diameter of each of the through holes 52 is smaller than the inner diameter of each of the through holes 42 provided in the ground plate 40. One of the through holes 52 corresponds to one of the through holes 42 provided in the ground plate 40. The through hole 52 and the through hole 42 corresponding to each other communicate with each other. For example, as shown in FIGS. 1 to 4, the intermediate insulating plate 50 and the ground plate 40 are overlappingly disposed such that the center axis of each of the through holes 52 and the center axis of each of the through holes 42 are aligned with each other in the corresponding through hole 52 and through hole 42. The intermediate insulating plate 50 is an example of an insulating plate.

The intermediate electrode plate 60 is made of a conductor, for example, metal or the like and is disposed between the intermediate insulating plate 50 and the upper electrode plate 70 provided above the intermediate insulating plate 50.

On the lower surface of the intermediate electrode plate 60, a plurality of substantially cylindrical protrusions 61 is formed. A through hole 62 penetrating the intermediate electrode plate 60 in the thickness direction of the intermediate electrode plate 60 and having a substantially cylindrical inner wall is formed in each of the protrusions 61 along the direction of the center axis of each of the protrusions 61. It is preferable that the center axis of the through hole 62 formed in each of the protrusions 61 be aligned with the center axis of each of the protrusions 61. The intermediate electrode plate 60 is an example of a first electrode plate. In addition, the through hole 62 is an example of a third through hole.

For example, as shown in FIGS. 3 and 4, the outer diameter of the outer wall of each of the protrusions 61 is smaller than the inner diameter of each of the through holes 52 provided in the intermediate insulating plate 50. One of the protrusions 61 corresponds to one of the through holes 52 provided in the intermediate insulating plate 50 and one of the through holes 42 provided in the ground plate 40. Each of the protrusions 61 is disposed in the corresponding through hole 52 and through hole 42. In the present embodiment, the intermediate electrode plate 60, the intermediate insulating plate 50, and the ground plate 40 are overlappingly disposed such that the center axis of each of the protrusions 61, the center axis of each of the through holes 52, and the center axis of each of the through holes 42 are aligned with one another in the corresponding protrusion 61, through hole 52, and through hole 42.

The outer diameter of the outer wall of each of the protrusions 61 is smaller than the inner diameter of each of the through holes 52 provided in the intermediate insulating plate 50 and is smaller than the inner diameter of each of the through holes 42 provided in the ground plate 40. Therefore, for example, as shown in FIGS. 2 and 3, a gap exists between the outer wall of each of the protrusions 61 and the inner wall of each of the through holes 52 and between the outer wall of each of the protrusions 61 and the inner wall of each of the through holes 42. Hereinafter, a space formed by the gap will be referred to as a second space S2. The gap formed between the outer wall of each of the protrusions 61 and the inner wall of each of the through holes 52 is an example of a second flow path.

On the lower surface of the intermediate electrode plate 60, a groove 63, a groove 64, and a groove 65 are provided. The groove 63 is provided on the lower surface of the intermediate electrode plate 60 around each of the protrusions 61. In the example of FIGS. 1 to 3, the groove 63, the groove 64, and the groove 65 extend in the y-axis direction which is the depth direction in FIG. 1. The groove 63 communicates with the groove 64, and the groove 64 communicates with the groove 65. The groove 63, the groove 64, and the groove 65 form a first flow path 68 with the upper surface of the intermediate insulating plate 50 when the intermediate insulating plate 50 and the intermediate electrode plate 60 are configured as the plasma electrode 30. For example, as shown in FIG. 3, the width of the groove 63 is larger than the width of a gap (i.e., a second flow path) formed between the inner wall of each of the through holes 52 of the intermediate insulating plate 50 and the outer wall of each of the protrusions 61 of the intermediate electrode plate 60.

The upper electrode plate 70 is formed of a conductor, for example, a metal or the like, and is overlappingly disposed on the intermediate electrode plate 60. On the lower surface of the upper electrode plate 70, grooves 71 are formed. In the present embodiment, the grooves 71 extend in the x-axis direction in FIG. 1 and are provided in a plurality of rows in the y-axis direction in FIG. 1. The upper electrode plate 70 is in contact with the intermediate electrode plate 60 on the region of the lower surface of the upper electrode plate 70 in which the grooves 71 are not provided. Thus, the upper electrode plate 70 and the intermediate electrode plate 60 are electrically connected to each other. In the case where the intermediate electrode plate 60 and the upper electrode plate 70 are configured as the plasma electrode 30, the respective grooves 71 form third flow paths 76 between the grooves 71 and the upper surface of the intermediate electrode plate 60. The respective third flow paths 76 communicate with the through holes 62 of the protrusions 61 provided in the intermediate electrode plate 60.

Further, a high-frequency power source 82 for generating a high frequency power of a predetermined frequency, for example, 13.56 MHz, is connected to the upper electrode plate 70. The high frequency power source 82 applies the generated high frequency power to the upper electrode plate 70. The high frequency power applied to the upper electrode plate 70 is propagated to the intermediate electrode plate 60 via the region of the lower surface of the upper electrode plate 70 in which the grooves 71 are not provided. The upper electrode plate 70 is an example of a second electrode plate.

The upper insulating plate 32 is made of an insulating material, for example, alumina or the like, and has a recess on the lower surface of the upper insulating plate 32. The upper insulating plate 32 is provided on the intermediate insulating plate 50 so that the intermediate electrode plate 60 and the upper electrode plate 70 are covered by the recess formed on the lower surface of the upper insulating plate 32. The intermediate electrode plate 60 and the upper electrode plate 70 are insulated from the housing 31 and the ground plate 40 by the intermediate insulating plate 50 and the upper insulating plate 32. In the upper insulating plate 32, there is formed a plurality of through holes 33 penetrating the upper insulating plate 32 in the thickness direction of the upper insulating plate 32. One of the through holes 33 corresponds to one of the through holes 51 provided in the intermediate insulating plate 50. The corresponding through hole 33 and through hole 51 communicate with each other.

The housing 31 is made of a conductive material, for example, metal or the like, and has a recess formed on the lower surface of the housing 31. The housing 31 is provided above the plasma electrode 30 so that the upper insulating plate 32 is covered by the recess formed on the lower surface of the housing 31. The housing 31 is grounded. The housing 31 is in contact with the upper end portion of the side wall of the chamber 10 around the recess formed on the lower surface of the housing 31 and is electrically connected to the chamber 10.

The housing 31 is provided with a plurality of through holes 34 penetrating the housing 31 in the thickness direction of the housing 31. One of the through holes 34 corresponds to one of the through holes 33 provided in the upper insulating plate 32. The corresponding through hole 34 and through hole 33 communicate with each other. The exhaust device 83 is connected to the respective through holes 34. The exhaust device 83 exhausts a gas existing in the through holes 34, the through holes 33, the through holes 51, and the recess 43, whereby, for example, as shown by a broken line arrow d1 in FIG. 3, the gas existing in the first space S1 is exhausted through the respective through holes 41 provided in the ground plate 40. The through hole 34, the through hole 33, and the through hole 51 are an example of an exhaust path.

For example, as shown in FIG. 1, a second gas supply source 81 for supplying a second processing gas is connected to the groove 65 provided on the lower surface of the intermediate electrode plate 60. In the present embodiment, the second processing gas is, for example, a mixed gas of an $N_2O$ gas and an $H_2$ gas. The second processing gas supplied from the second gas supply source 81 to the groove 65 flows through the first flow path 68 formed between the groove 65 and the upper surface of the intermediate insulating plate 50 and is supplied to the groove 63. The second processing gas supplied to the groove 63 is supplied to the second space S2 via the second flow path which is a gap formed between the inner wall of each of the through holes 52 of the intermediate insulating plate 50 and the outer wall of each of the protrusions 61 of the intermediate electrode plate 60, for example, as indicated by a broken line arrow d2 in FIG. 3.

In addition, the high frequency power applied from the high frequency power source 82 to the upper electrode plate 70 is propagated to the intermediate electrode plate 60. Since the ground plate 40 is grounded, a high frequency electric field is generated between the outer wall of each of the protrusions 61 and the inner wall of each of the through holes 42 of the ground plate 40 by the high frequency power propagated to the intermediate electrode plate 60. Since the distance between the outer wall of each of the protrusions 61 and the inner wall of each of the through holes 42 of the ground plate 40 is much shorter than the distance between the intermediate electrode plate 60 and the mounting table 2, a strong high frequency electric field is generated in the second space S2.

Thus, the second processing gas supplied to the second space S2 is converted into plasma by the strong high frequency electric field generated in the second space S2. At this time, electrons supplied from the protrusions 61 collide with molecules of the second processing gas, whereby active species are generated. In the present embodiment, the second processing gas is a mixed gas of an $N_2O$ gas and an $H_2$ gas. Since a strong high frequency electric field is generated in the second space S2, molecules such as $N_2O$ and $H_2$ are sufficiently excited in the second space S2, whereby many O radicals and H radicals are generated. The O radicals and the H radicals generated in the second space S2 flow down to the first space S1 below the second space S2.

For example, as shown in FIG. 1, a first gas supply source 80 for supplying a first processing gas is connected to the third flow paths 76 formed by the grooves 71 on the lower surface of the upper electrode plate 70. In the present embodiment, the first processing gas is, for example, a mixed gas of a $SiH_4$ gas and an $H_2$ gas. The first processing gas supplied from the first gas supply source 80 to the third flow paths 76 flows through the third flow paths 76 and is supplied into the through holes 62 provided in the protrusions 61 of the intermediate electrode plate 60. The first processing gas supplied to the through holes 62 is discharged to the first space S1 below the plasma electrode 30, for example, as indicated by a broken line arrow d3 in FIG. 3.

Plasma of the first processing gas is generated between the plasma electrode 30 and the substrate W by the high frequency power applied to the plasma electrode 30. However, the distance between the plasma electrode 30 and the substrate W is much longer than the distance between the outer wall of each of the protrusions 61 and the inner wall of each of the through holes 42. In addition, the substrate W mounted on the mounting table 2 is in an electrically floating state. Therefore, the high frequency electric field generated in the first space S1 is much weaker than the high frequency electric field generated in the second space S2. That is to say, in the first space S1, plasma weaker than the plasma generated in the second space S2 is generated. Thus, as compared with the case where strong plasma is generated in the entire first space S1, it is possible to reduce the damage given to the substrate W by plasma.

In the present embodiment, an $N_2O$ gas and an $H_2$ gas are supplied as the second processing gas into the second space S2. The second processing gas is converted into plasma in the second space S2. Thus, O radicals and H radicals, which are active species of the second processing gas, are supplied into the first space S1. A $SiH_4$ gas and an $H_2$ gas, for example, are supplied as the first processing gas into the first space S1. In the $SiH_4$ gas supplied into the first space S1, a reaction represented by the following formula (1) proceeds under the action of the H radicals supplied from the second space S2.

$$SiH_4 + H \rightarrow SiH_3 + H_2 \qquad (1)$$

Then, $SiH_3$ reacts with the O radicals flowing down from the second space S2 to form a $SiO_2$ film on the substrate W.

In this regard, if the time for the $SiH_4$ gas to stay in the first space S1 is long, $SiH_3$ generated by the reaction represented in the above formula (1) further reacts with H radicals. Then, active species having a plurality of dangling bonds, such as $SiH_2$ and SiH, are generated. Then, the active species having a plurality of dangling bonds react with O radicals to form a $SiO_2$ film on the substrate W.

A large amount of lattice defects are contained in the $SiO_2$ film formed on the substrate W by the active species having a plurality of dangling bonds such as $SiH_2$ and SiH. Thus, the $SiO_2$ film may easily crack due to physical impact and is fragile. Therefore, when an antifouling film is laminated on the $SiO_2$ film containing such defects, the $SiO_2$ film is likely to break due to physical impact such as rubbing against the antifouling film. When the $SiO_2$ film is broken, the antifouling film easily peels off. As a result, durability of the antifouling film against physical impact such as rubbing or the like is reduced.

On the other hand, since the lattice defects are small in the $SiO_2$ film formed by $SiH_3$ having one dangling bond, the flexibility of the $SiO_2$ film is enhanced and the $SiO_2$ film is less likely to be broken by physical impact such as rubbing against the antifouling film or the like. Therefore, the antifouling film is less likely to peel off against physical impact such as rubbing or the like, and the durability of the antifouling film is improved. Accordingly, it is preferable that an appropriate concentration of H atoms is contained in the $SiO_2$ film formed on the substrate W as a base film of the antifouling film.

Therefore, in the plasma electrode 30 of the present embodiment, the inside of the first space S1 is evacuated from above the first space S1 via the through holes 41 formed on the lower surface of the plasma electrode 30. Thus, it is possible to shorten the time for the $SiH_4$ gas to stay in the first space S1, which makes it possible to suppress excessive dissociation of $SiH_4$ molecules. As a result, it is possible to form a $SiO_2$ film with less lattice defects on the substrate W. This makes it possible to form a more flexible and supple $SiO_2$ film on the substrate W. Accordingly, by forming the antifouling film on the $SiO_2$ film formed using the plasma electrode 30 of the present embodiment, it is possible to improve the durability of the antifouling film against physical impact such as rubbing or the like.

The time for the $SiH_4$ gas to stay in the first space S1 can be controlled by a distance between the plasma electrode 30 and the substrate W, a flow rate of the $SiH_4$ gas, or the like. Accordingly, by controlling the distance between the plasma electrode 30 and the substrate W, the flow rate of the SiH$_4$ gas, or the like, it is possible to control the time for the SiH$_4$ gas to stay in the first space S1. This makes it possible to form a SiO$_2$ film having desired characteristics.

[Details of Arrangement of Through Holes 41]

FIG. 5 is an enlarged view showing an example of the lower surface of the plasma electrode 30. On the ground plate 40 provided on the lower surface of the plasma electrode 30, for example, as shown in FIG. 5, the plurality of through holes 41 and the plurality of through holes 42 each having a substantially circular opening are arranged. In respective through holes 42, the substantially cylindrical protrusions 61 formed on the lower surface of the intermediate electrode plate 60 are disposed. The through hole 62 is formed in each of the protrusions 61 along a center axis 62a of the each of the protrusions 61.

In the present embodiment, the intermediate electrode plate 60, the intermediate insulating plate 50, and the ground plate 40 are overlappingly arranged such that the center axis of each of the protrusions 61, the center axis of each of the through holes 52, and the center axis of each of the through holes 42 are aligned with one another in the corresponding protrusion 61, the through hole 52, and the through hole 42. In the example of FIG. 5, the center axis 62a of each of the protrusions 61 is aligned with the center axis of each of the through holes 52 and the center axis of each of the through holes 42.

The first processing gas is supplied from the through holes 62 to the first space S1, and the second processing gas is supplied from the gap between the outer wall of each of the protrusions 61 and the inner wall of each of the through holes 52 to the second space S2. The second processing gas supplied to the second space S2 is converted into plasma in the second space S2 by the high frequency electric power applied to the protrusions 61 via the upper electrode plate 70. Then, the active species generated from the second processing gas flow down to the first space S1.

The gas in the first space S1 is exhausted through the plurality of through holes 41. For example, as shown in FIG. 5, the through holes 41 are arranged on a circumference C about the center axis 62a of the through holes 62 of each of the protrusions 61 when viewed from the direction extending along the z axis. Further, for example, as shown in FIG. 5, the respective through holes 41 are arranged at equal distances from the three adjacent through holes 62 on the lower surface of the ground plate 40. Specifically, in the respective through holes 41, a center axis 41a of each of the through holes 41 is arranged at a position equidistant from the center axes 62a of the three adjacent through holes 62.

For example, as shown in FIG. 5, if the distances from the center axis 41a of each of the through holes 41 to the center axes 62a of the three adjacent through holes 62 are assumed to be L1, L2, and L3, respectively, each of the through holes 41 is disposed at a position where L1=L2=L3. Further, in the present embodiment, the center axis 62a of each of the through holes 62 is aligned with the center axis of each of the through holes 52 and the center axis of each of the through holes 42. Therefore, the active species of the first processing gas supplied into the first space S1 from the through holes 62 and the active species of the second processing gas generated in the second space S2 can suppress variations in the distance to the through holes 41 at an arbitrary place in the first space S1 under the plasma electrode 30. Accordingly, in the first space S1 under the plasma electrode 30, it is possible to reduce variations in the staying time of molecules of the first processing gas excited by the active species of the second processing gas. Thus, it is possible to form a more uniform film on the substrate W.

[Structure of Intermediate Electrode Plate 60]

Figure 6:
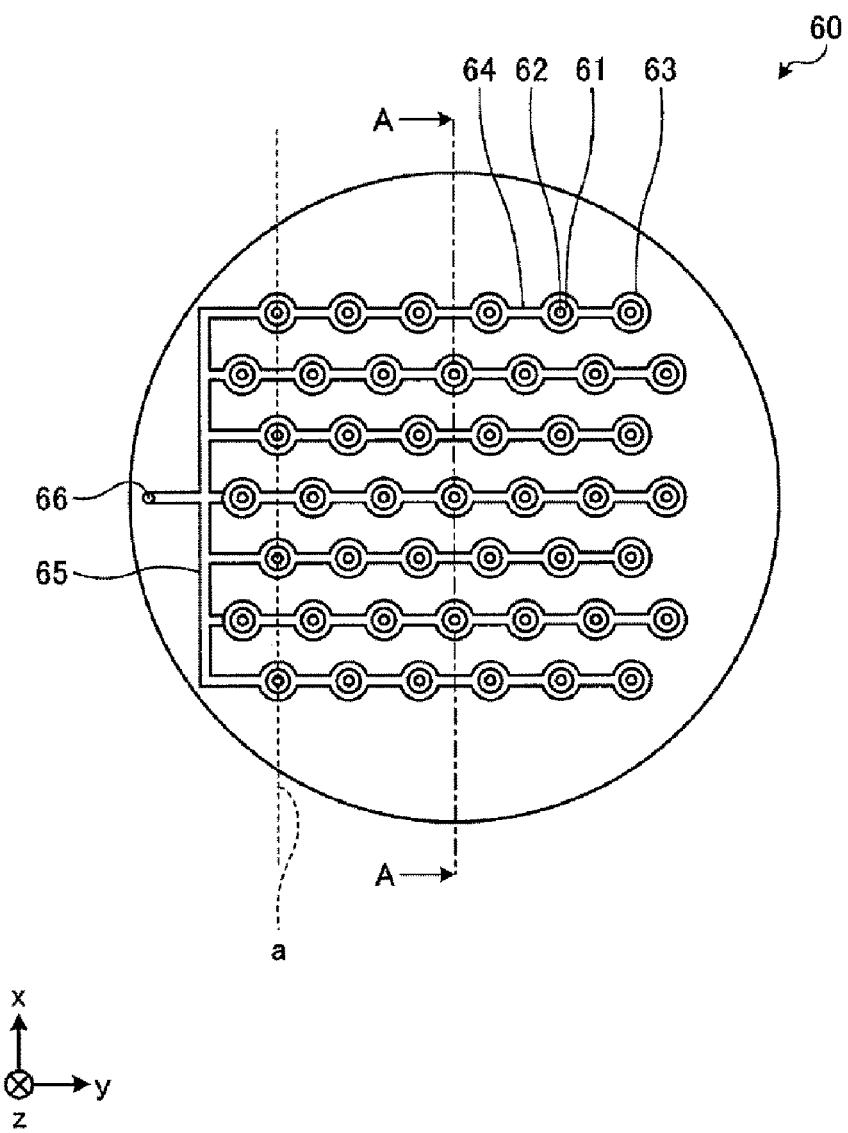
FIG. 6 is a view showing an example of a lower surface of an intermediate electrode plate.
Figure 7:
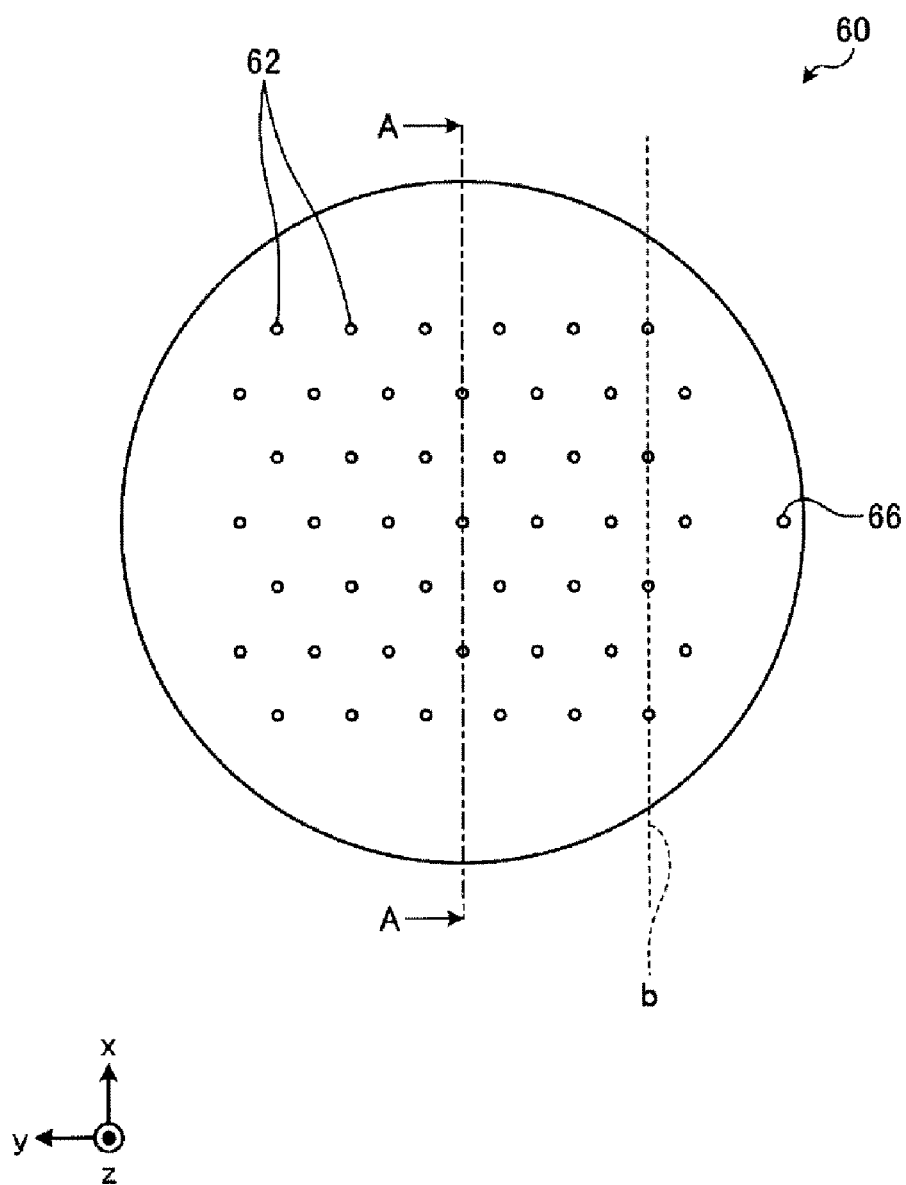
FIG. 7 is a view showing an example of an upper surface of the intermediate electrode plate.

FIG. 6 is a view showing an example of the lower surface of the intermediate electrode plate 60. FIG. 7 is a view showing an example of the upper surface of the intermediate electrode plate 60. On the lower surface of the intermediate electrode plate 60, for example, as shown in FIG. 6, the plurality of substantially cylindrical protrusions 61 is provided. For example, as shown in FIGS. 6 and 7, through holes 62 penetrating the intermediate electrode plate 60 in the thickness direction of the intermediate electrode plate 60 are provided in the respective protrusions 61.

For example, as shown in FIG. 6, the grooves 63 are provided around the respective protrusions 61 on the lower surface of the intermediate electrode plate 60. Two grooves 63 adjacent in the y-axis direction communicate with each other via the groove 64, for example, as shown in FIG. 6. The grooves 63 and the grooves 64 adjacent to each other in the y-axis direction form the first flow paths 68 with the upper surface of the intermediate insulating plate 50 when the intermediate insulating plate 50 and the intermediate electrode plate 60 are configured as the plasma electrode 30. In the present embodiment, each of the first flow paths 68 extends in the y-axis direction.

End portions of the respective first flow paths 68 communicate with a through hole 66 via a space formed between the grooves 65 and the upper surface of the intermediate insulating plate 50. The second processing gas supplied from the second gas supply source 81 is supplied to the first flow paths 68 via the through hole 66.

The second processing gas supplied via the through hole 66 flows through the respective first flow paths 68 and is supplied to the respective grooves 63. The second processing gas supplied to the respective grooves 63 is supplied to the second space S2 between the inner wall of each of the through holes 42 of the ground plate 40 and the outer wall of each of the protrusions 61 via a gap (i.e., a second flow path) between the inner wall of each of the through holes 52 of the intermediate insulating plate 50 and the outer wall of each of the protrusions 61.

In this regard, as shown in FIG. 3, the width of each of the grooves 63 is larger than the width of the gap (i.e., the second flow path) formed between the inner wall of each of the through holes 52 of the intermediate insulating plate 50 and the outer wall of each of the protrusions 61 of the intermediate electrode plate 60. Therefore, a part of the second processing gas supplied to each of the grooves 63 is supplied to the second space S2 via the gap formed between the inner wall of each of the through holes 52 of the intermediate insulating plate 50 and the outer wall of each of the protrusions 61 of the intermediate electrode plate 60. The remaining second processing gas is supplied to the adjacent groove 63 via the groove 64. Accordingly, the second processing gas supplied from the through hole 66 is supplied to each of the grooves 63 via the first flow paths 68 and is supplied from each of the grooves 63 to the second space S2 existing under each of the grooves 63.

[Structure of Upper Electrode Plate 70]

Figure 8:
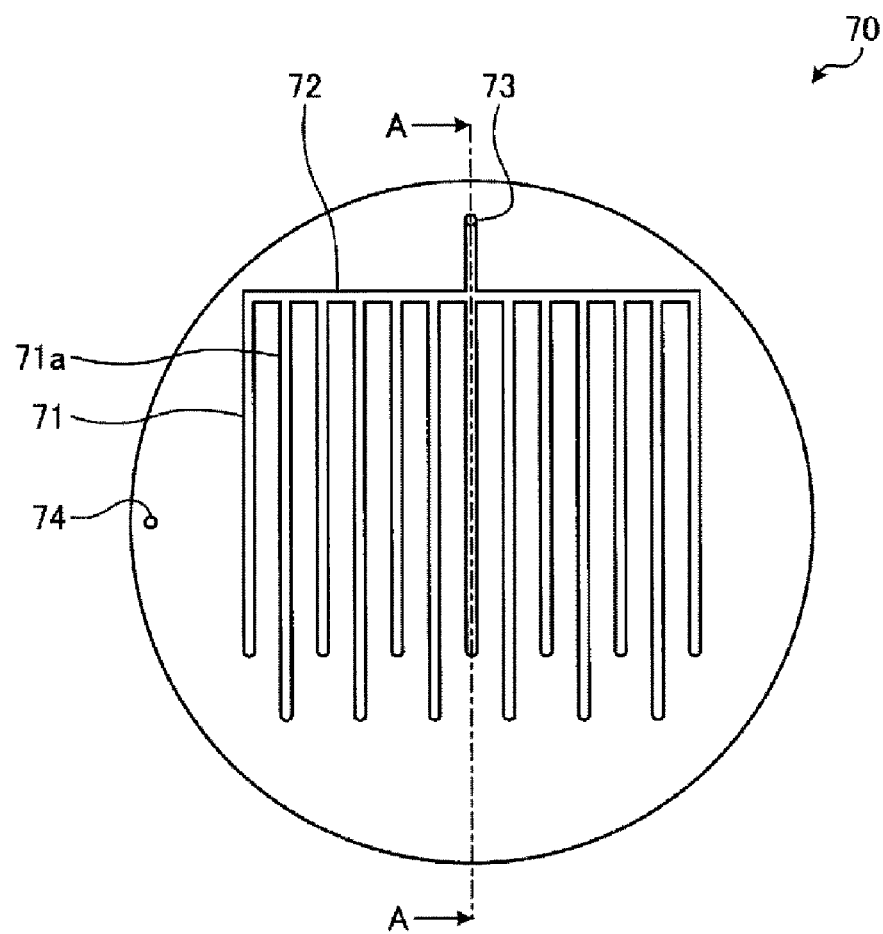
FIG. 8 is a view showing an example of a lower surface of an upper electrode plate.

FIG. 8 is a view showing an example of the lower surface of the upper electrode plate 70. On the lower surface of the upper electrode plate 70, the plurality of grooves 71 extending along the x-axis direction is provided. The grooves 71 extending in the x-axis direction form the third flow paths 76 with the upper surface of the intermediate electrode plate 60 when the intermediate electrode plate 60 and the upper electrode plate 70 are configured as the plasma electrode 30.

In the present embodiment, each of the third flow paths 76 extends in the x-axis direction. One end of each of the third flow paths 76 communicates with a through hole 73 via a space formed between grooves 72 and the upper surface of the intermediate electrode plate 60. The first processing gas supplied from the first gas supply source 80 is supplied to the third flow paths 76 via the through hole 73.

Each of the third flow paths 76 communicates with one row of through holes 62 arranged along the x-axis direction on the upper surface of the intermediate electrode plate 60. For example, when the intermediate electrode plate 60 and the upper electrode plate 70 are configured as the plasma electrode 30, the third flow paths 76 formed by grooves 71$a$ shown in FIG. 8 communicate with the plurality of through holes 62 arranged in one row along, for example, a broken line as shown in FIG. 6 and a broken line b as shown in FIG. 7. The first processing gas supplied to the respective third flow paths 76 flows through the third flow paths 76 and is supplied to the first space S1 under the plasma electrode 30 via the respective through holes 62 communicating with the third flow paths 76.

In the present embodiment, the first flow paths 68 formed by the grooves 63 and the grooves 64 formed on the lower surface of the intermediate electrode plate 60 and the upper surface of the intermediate insulating plate 50 extend in the y-axis direction, for example, as shown in FIGS. 2 and 6. On the other hand, for example, as shown in FIG. 8, the third flow paths 76 formed by the grooves 71 formed on the lower surface of the upper electrode plate 70 and the upper surface of the intermediate insulating plate 50 extend along the x-axis direction. In the present embodiment, the extension direction of each of the first flow paths 68 and the extension direction of each of the third flow paths 76 are orthogonal to the center axis of the through hole 62 of each of the protrusions 61 when projected on the plane parallel to the lower surface of the intermediate electrode plate 60 from the direction of the z-axis. The y-axis direction is an example of a first direction, and the x-axis direction is an example of a second direction.

Further, the upper electrode plate 70 is provided with a through hole 74 penetrating the upper electrode plate 70 in the thickness direction of the upper electrode plate 70. When the intermediate electrode plate 60 and the upper electrode plate 70 are configured as the plasma electrode 30, the through hole 74 communicates with the through hole 66 of the intermediate electrode plate 60 and supplies the second processing gas supplied from the second gas supply source 81 to the through hole 66.

The operation of the plasma processing device 1 configured as described above is totally controlled by a controller 90. The controller 90 includes a processor 92, which has a CPU (Central Processing Unit) or the like and controls the respective parts of the plasma processing device 1, a memory 91, and a user interface 93.

The user interface 93 includes a keyboard used for inputting commands or the like by an operator to operate the plasma processing device 1, a display for visually displaying the operation state of the plasma processing device 1, and the like.

The memory 91 stores a control program (software) for enabling the processor 92 to realize various processes to be executed by the plasma processing device 1, a recipe storing data of processing conditions, and the like. The processor 92 reads the control program stored in the memory 91 and operates based on the read control program. The processor 92 reads the recipe or the like from the memory 91 according to an instruction or the like received from an operator via the user interface 93, and controls the plasma processing device 1 based on the read recipe or the like. Thus, desired processing is performed by the plasma processing device 1.

In addition, the processor 92 may also read and execute a control program, a recipe or the like stored in a computer readable recording medium or the like. The computer readable recording medium is, for example, a hard disk, a DVD (Digital Versatile Disc), a flexible disk, a semiconductor memory, or the like. Further, the processor 92 may also acquire a control program, a recipe or the like stored in a memory part of another device, for example, via a communication line, and may execute the same.

In the case where a predetermined base film is formed on the substrate W by using the plasma processing device 1, the controller 90 performs the following control with respect to the plasma processing device 1. First, in a state in which the substrate W is mounted on the mounting table 2, the controller 90 controls the exhaust device 14 to exhaust the gas existing in the chamber 10 until the inside of the chamber 10 reaches a predetermined degree of vacuum. Then, the controller 90 controls the first gas supply source 80 to supply the first processing gas into the first space S1 from the through hole 62 of each of the protrusions 61. Further, the controller 90 controls the second gas supply source 81 to supply the second processing gas into the second space S2 between the inner wall of each of the through holes 41 of the ground plate 40 and the outer wall of each of the protrusions 61 of the intermediate electrode plate 60. Further, the controller 90 controls the exhaust device 83 to evacuate the inside of the first space S1 via the respective through holes 41. Then, the controller 90 controls the high frequency power source 82 to apply the high frequency power to the upper electrode plate 70, thereby generating plasma of the second processing gas in the second space S2 and generating plasma of the first processing gas in the space S1. As a result, active species of the second processing gas generated in the second space S2 flows down to the first space S1. Then, the active species of the second processing gas reacts with molecules of the first processing gas in the first space S1, whereby active species of the first processing gas are generated. Then, a predetermined film is formed on the substrate W by the active species of the first processing gas and the active species of the second processing gas.

An example of a specific type of gas species and numerical values is as follows, for example. First, in a state in which the substrate W is mounted on the mounting table 2, the controller 90 controls the exhaust device 14 to exhaust the gas existing in the chamber 10 until the inside of the chamber 10 reaches a predetermined degree of vacuum. Then, the controller 90 controls the first gas supply source 80 to supply the first processing gas, for example, a mixed gas of a $SiH_4$ gas and an $H_2$ gas, from the through hole 62 of each of the protrusions 61 into the first space S1. For example, the first gas supply source 80 supplies the mixed gas into the first space S1 by controlling the flow rate of the $SiH_4$ gas to 6 sccm and controlling the flow rate of the $H_2$ gas to 1,000 sccm.

Further, the controller 90 controls the second gas supply source 81 to supply the second processing gas, for example, a mixed gas of an $N_2O$ gas and an $H_2$ gas, into the second space S2 between the inner wall of each of the through holes 41 of the ground plate 40 and the outer wall of each of the protrusions 61 of the intermediate electrode plate 60. For example, the second gas supply source 81 supplies the mixed gas into the second space S2 by controlling the flow rate of the $N_2O$ gas to 200 sccm and controlling the flow rate of the $H_2$ gas to 100 sccm. Then, the controller 90 controls the exhaust device 83 to evacuate the inside of the first space S1 through the respective through holes 41.

Then, the controller 90 controls the high frequency power source 82 to apply high frequency power of, for example, 500 W to the upper electrode plate 70 and the intermediate electrode plate 60. As a result, the plasma of the second processing gas is generated in the second space S2. In the present embodiment, the diameters of the upper electrode plate 70 and the intermediate electrode plate 60 are, for example, 25 cm. Thus, a power density of the high frequency power applied to the intermediate electrode plate 60 and the upper electrode plate 70 is approximately 1 W/cm$^2$.

As a result, the O radicals and the H radicals, which are active species of the second processing gas generated in the second space S2, flow down to the first space S1. Then, the H radicals, which are the active species of the second processing gas, react with the SiH$_4$ molecules of the first processing gas in the first space S1 to generate SiH$_3$ which is the active species of the first processing gas. Then, a SiO$_2$ film is formed on the substrate W by SiH$_3$, which is the active species of the first processing gas, and the O radicals, which are the active species of the second processing gas. SiH$_3$, which is the active species of the first processing gas generated in the first space S1, is exhausted from the first space S1 via the respective through holes 41. As a result, excessive dissociation of the active species of the first processing gas is suppressed, and a SiO$_2$ film of a predetermined quality can be formed. In addition, since the excessive dissociation of the active species of the first processing gas is suppressed, excessive gas phase growth due to the active species of the first processing gas is suppressed in the first space S1, and generation of particles is suppressed.

When resistance against physical damage of an antifouling film which uses a SiO$_2$ film formed using the plasma processing device 1 according to the present embodiment as a base layer is compared with resistance against physical damage of an antifouling film which uses a SiO$_2$ film formed by a plasma CVD device using ICP as a base layer, it was found that the resistance against physical damage is higher in the antifouling film which uses the SiO$_2$ film formed using the plasma processing device 1 according to the present embodiment as a base layer. The resistance against physical damage was evaluated, for example, by performing a rubbing test with a steel wool under a predetermined load and measuring a contact angle of a water droplet on the surface of the substrate W. After the rubbing test is performed 20,000 times, the antifouling film which uses the SiO$_2$ film formed using the plasma processing device 1 according to the present embodiment as a base layer was larger in the contact angle of a water droplet and smaller in variations of the contact angle than the antifouling film which uses the SiO$_2$ film formed by a plasma CVD device using ICP as a base layer. Accordingly, by forming the SiO$_2$ film, which is the base layer of the antifouling film, on the substrate W using the plasma processing device 1 of the present embodiment, it is possible to improve durability against physical damage of the antifouling film as compared with related art.

As is apparent from the above description on the first embodiment, according to the plasma processing device 1 of the present embodiment, it is possible to form a more flexible and supple base film. This makes it possible to improve the durability against physical damage of the antifouling film formed on the base film.

Figure 9A:
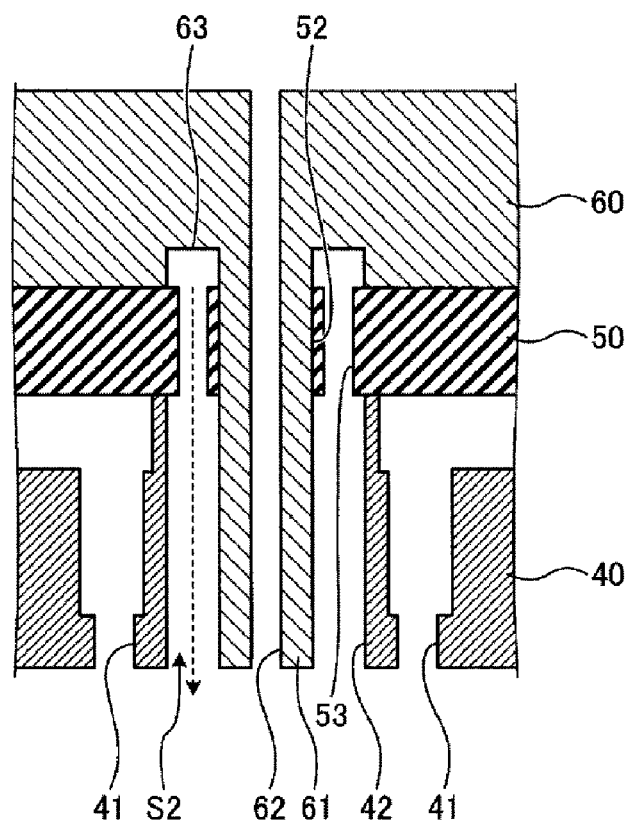
FIGS. 9A and 9B are views showing another example of a structure around a protrusion of the intermediate electrode plate.
Figure 9B:
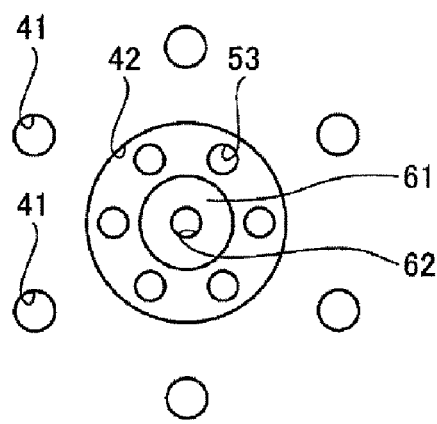

In the plasma processing device 1 according to the first embodiment, the second processing gas is supplied to the second space S2 via the second flow path which is the gap formed between the inner wall of each of the through holes 52 of the intermediate insulating plate 50 and the outer wall of each of the protrusions 61 of the intermediate electrode plate 60. However, the second flow path is not limited thereto. FIGS. 9A and 9B are views showing another example of the structure around each of the protrusions 61 of the intermediate electrode plate 60. For example, as shown in FIGS. 9A and 9B, the second processing gas may be supplied into the second space S2 via a plurality of through holes 53, which is disposed around each of the protrusions 61 of the intermediate electrode plate 60 and surrounds each of the through holes 52 of the intermediate insulating plate 50. Each of the through holes 53 is an example of the second flow path. In addition, each of the through holes 53 is an example of a fifth through hole.

In the example shown in FIG. 9B, six through holes 53 are arranged around each of the protrusions 61. However, the number of the through holes 53 arranged around each of the protrusions 61 may be seven or more, or may be five or less. In any case, it is preferable that the through holes 53 arranged around each of the protrusions 61 are disposed at approximately equal intervals.

Figure 10A:
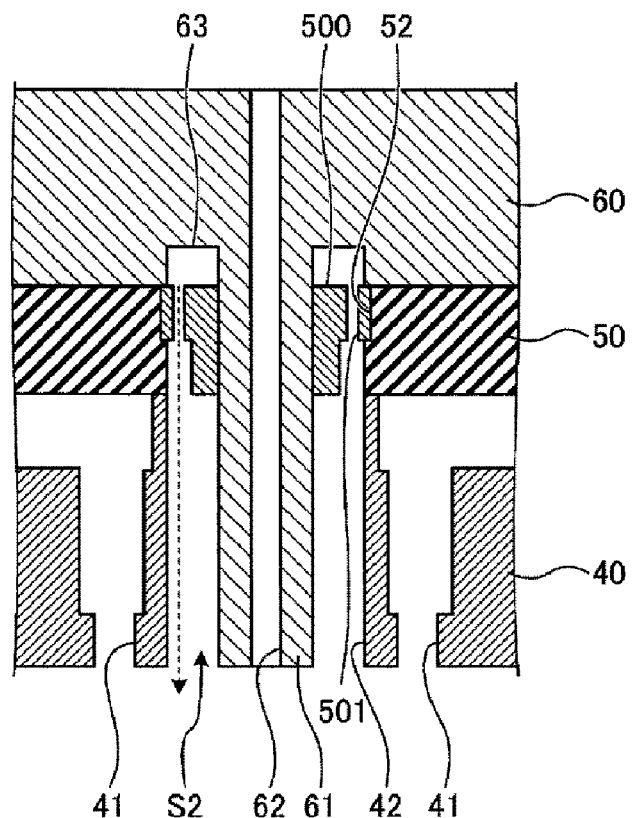
FIGS. 10A and 10B are views showing a further example of the structure around the protrusion of the intermediate electrode plate.
Figure 10B:
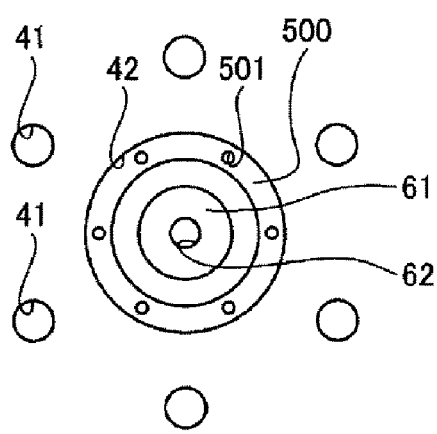

FIGS. 10A and 10B are views showing another example of the structure around each of the protrusions 61 of the intermediate electrode plate 60. For example, as shown in FIGS. 10A and 10B, the second processing gas may be supplied into the second space S2 via through holes 501 provided in a member 500 surrounding each of the protrusions 61 of the intermediate electrode plate 60. Each of the through holes 501 is an example of the second flow path. In addition, each of the through holes 501 is an example of the fifth through hole. The member 500 is made of an insulating material and is fitted into each of the through holes 52 of the intermediate insulating plate 50.

In the example shown in FIG. 10B as well, six through holes 501 are arranged around each of the protrusions 61. However, the number of the through holes 501 arranged around each of the protrusions 61 may be seven or more, or may be five or less. In any case, it is preferable that the through holes 501 arranged around each of the protrusions 61 are arranged at approximately equal intervals.

Figure 11:
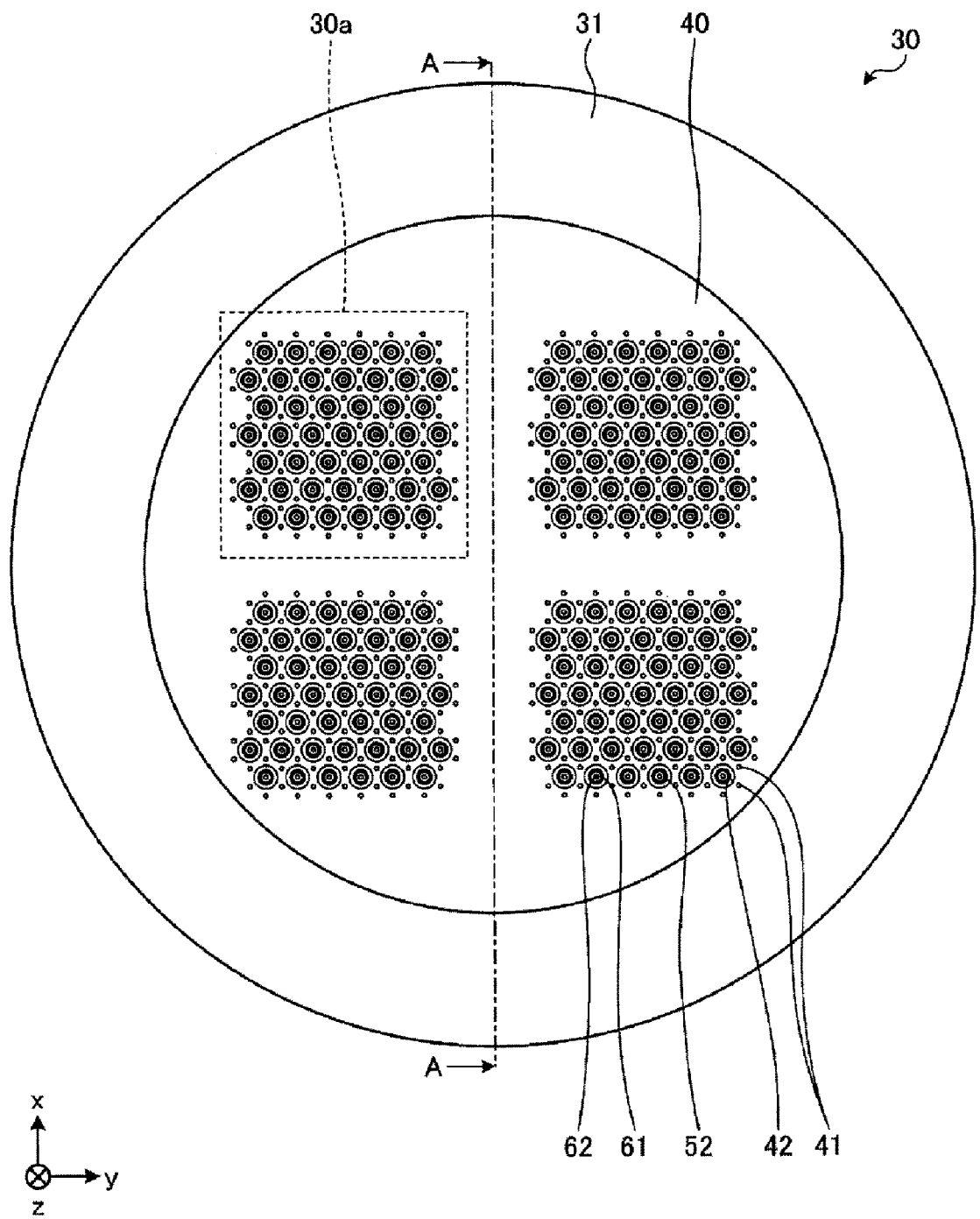
FIG. 11 is a view showing another example of the plasma electrode.

Further, in order to process a larger number of substrates W at once, for example, as shown in FIG. 11, the size of the plasma electrode 30 may be increased. FIG. 11 is a view showing another example of the plasma electrode 30. In FIG. 11, the lower surface of the plasma electrode 30 according to another example is shown. In the plasma electrode 30 shown in FIG. 11, there is arranged a plurality of units 30a each of which has, similar to the plasma electrode 30 described with reference to FIGS. 1 to 8, a plurality of through holes 41, a plurality of through holes 42, a plurality of through holes 52, a plurality of protrusions 61, and a plurality of through holes 62. In the plasma electrode 30 shown in FIG. 11, four units 30a are arranged. As a result, it is possible to form a base film of SiO$_2$ or the like on a larger number of substrates W, which makes it possible to improve the throughput.

It is preferable that the units 30a are disposed symmetrically with respect to the center axis of the plasma electrode 30 on the lower surface of the plasma electrode 30. Further, it is preferable that the first processing gas and the second processing gas supplied to the respective units 30a are supplied from substantially the center of the plasma electrode 30 and are distributed to the respective units 30a. Moreover, it is preferable that the exhaust paths communicating with the through holes 41 of the respective units 30a are concentrated at substantially the center of the plasma electrode 30 and are connected to the exhaust device 83.

This makes it possible to suppress unevenness in flow rates of the first processing gas and the second processing gas and unevenness in exhaust amounts between the respective units 30a. Thus, it is possible to suppress variations in quality of the base film between a plurality of substrates W on which the base film is formed.

In the plasma processing device 1 according to the first embodiment described above, the first processing gas is supplied into the first space S1 via the through holes 62 formed in the respective protrusions 61 of the intermediate electrode plate 60, and the gas existing in the first space S1 is exhausted via the through holes 41 formed in the ground plate 40. However, the disclosed technique is not limited thereto. In another embodiment, the first processing gas may be supplied into the first space S1 via the through holes 41 formed in the ground plate 40, and the gas existing in the first space S1 may be exhausted via the through holes 62 formed in the respective protrusions 61 of the intermediate electrode plate 60.

Further, in the first embodiment described above, the first flow paths 68 provided on the lower surface of the intermediate electrode plate 60 and configured to allow the second processing gas to flow therethrough, and the third flow paths 76 provided on the lower surface of the upper electrode plate 70 and configured to allow the first processing gas to flow therethrough are orthogonal to each other at the center axes of the through holes 62 of the respective protrusions 61 when projected onto the plane parallel to the lower surface of the intermediate electrode plate 60 from the direction parallel to the z axis. However, the disclosed technique is not limited thereto. For example, the respective first flow paths 68 and the respective third flow paths 76 may intersect with each other at an angle different from the right angle at the center axes of the through holes 62 of the respective protrusions 61 when projected onto a plane parallel to the lower surface of the intermediate electrode plate 60 from the direction parallel to the z-axis. Further, the respective first flow paths 68 and the respective third flow paths 76 may be substantially parallel to each other.

In the plasma processing device 1 according to the above-described embodiment, the $SiO_2$ film is formed as a base layer on the substrate W, for example, by using a mixed gas of an $SiH_4$ gas and an $H_2$ gas as the first processing gas and using a mixed gas of an $N_2O$ gas and an $H_2$ gas as the second processing gas. However, the disclosed technique is not limited thereto. In another embodiment, the plasma processing device 1 may form an amorphous silicon film or a microcrystalline silicon film on the substrate W by using, for example, an $SiH_4$ gas as the first processing gas and using, for example, an $H_2$ gas as the second processing gas.

In this case, the $H_2$ gas supplied into the second space S2 sufficiently dissociates in the second space S2 and reacts with the $SiH_4$ gas supplied into the first space S1. Then, an amorphous silicon film or a microcrystalline silicon film is formed on the substrate W by $SiH_3$ generated in the first space S1. The $SiH_3$ generated in the first space S1 is exhausted from the through holes 41 provided in the ground plate 40. As a result, the $SiH_4$ molecules supplied into the first space S1 are exhausted from the through holes 41 before the reaction with the H radicals generated in the second space S2 proceeds excessively. Accordingly, unnecessary active species other than $SiH_3$ are reduced in the first space S1. This makes it possible to form a high-quality amorphous silicon film or microcrystalline silicon film on the substrate W.

Second Embodiment

[Configuration of Film Forming System 100]

Figure 12:
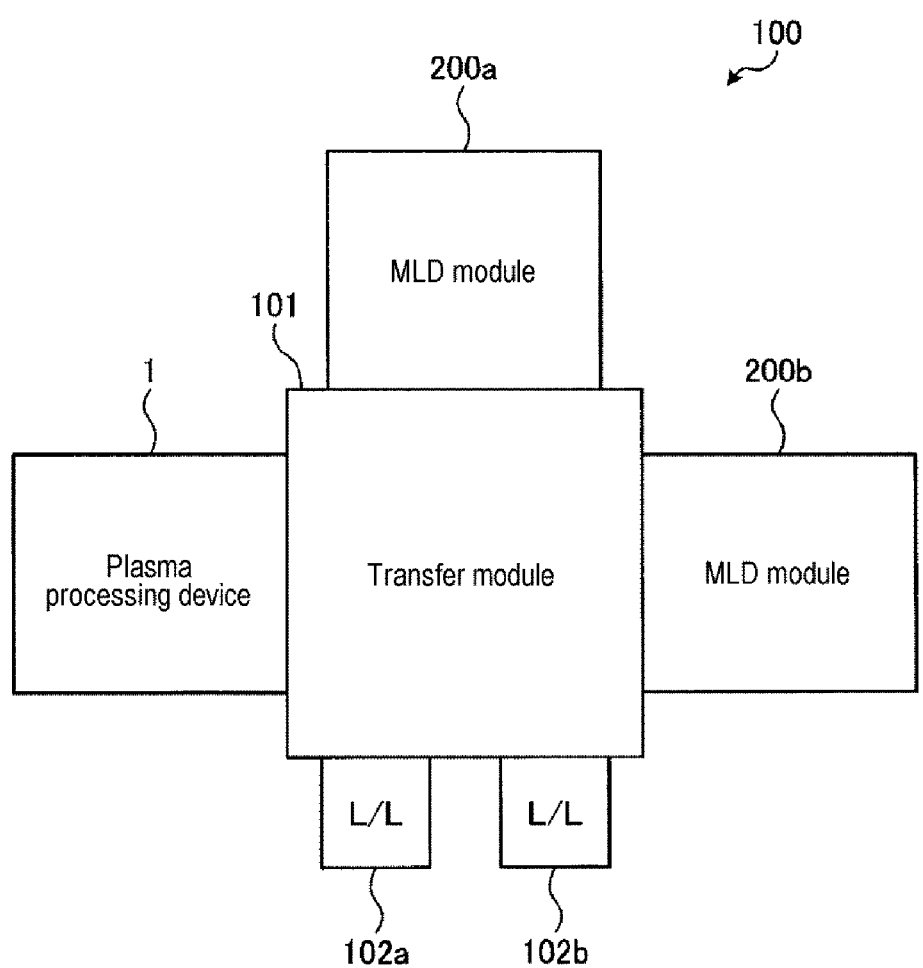
FIG. 12 is a view showing an example of a film forming system.

FIG. 12 is a view showing an example of a film forming system 100. The film forming system 100 of the present embodiment is a system for forming an antifouling film on a substrate W. In the present embodiment, the substrate W is, for example, chemically strengthened glass. For example, as shown in FIG. 12, the film forming system 100 includes a plasma processing device 1, a transfer module 101, a plurality of load lock chambers (L/L) 102a and 102b, and a plurality of MLD (Monomolecular Layer Deposition) modules 200a and 200b. In the following description, the respective load lock chambers 102a and 102b will be simply referred to as a load lock chamber 102 when they are generically named without distinguishing them, and the respective MLD modules 200a and 200b will be simply referred to as an MLD module 200 when they are generically named without distinguishing them.

In the load lock chamber 102, an unprocessed substrate W is set by an operator or the like. A transfer device such as a movable robot arm or the like is provided in the transfer module 101. The unprocessed substrate W is taken out from the load lock chamber 102 by the transfer device and is carried into the plasma processing device 1. The inside of the transfer module 101 is kept at a predetermined degree of vacuum.

The plasma processing device 1 forms a primer layer and an organic molecular seed layer on the substrate W that has been carried into the plasma processing device 1. The substrate W on which the primer layer and the organic molecular seed layer have been formed is carried out from the plasma processing device 1 by the transfer device in the transfer module 101 and is carried into one of the MLD modules 200. In the MLD module 200, an antifouling film is formed on the substrate W on which the primer layer and the organic molecular seed layer are formed. The substrate W on which the antifouling film has been formed is carried out from the MLD module 200 by the transfer device in the transfer module 101 and is transferred to one of the load lock chambers 102.

[Plasma Processing Device 1]

Figure 13:
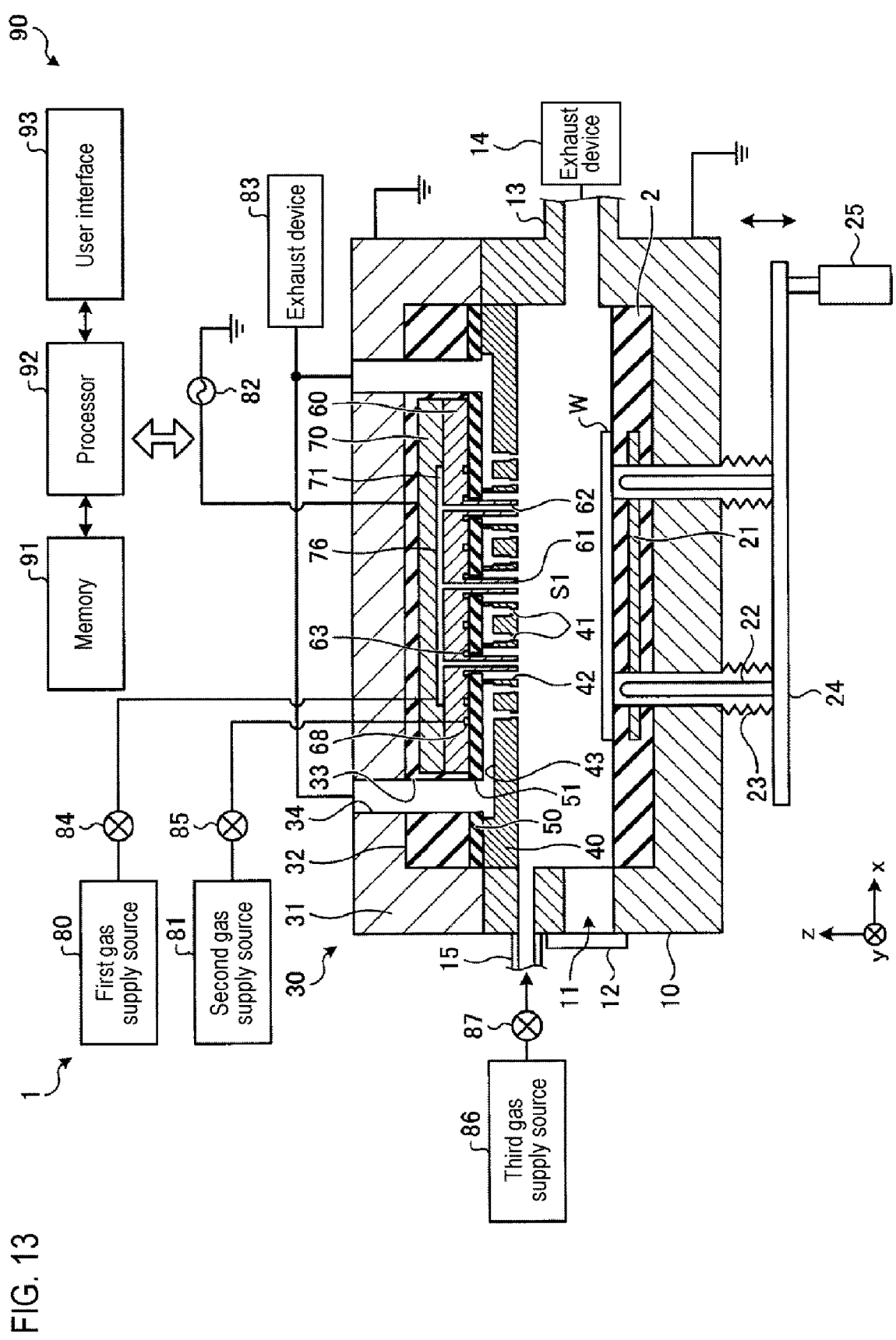
FIG. 13 is a view showing an example of a plasma processing device according to a second embodiment.

FIG. 13 is a view showing an example of the plasma processing device 1 according to a second embodiment. Except for the points described below, in FIG. 13, the elements designated by the same reference numerals as those used in FIG. 1 are the same as or similar in function to those described with reference to FIG. 1. Therefore, detailed description thereof will be omitted.

The first gas supply source 80 is connected to the third flow path 76 formed on the lower surface of the upper electrode plate 70 via a valve 84. The second gas supply source 81 is connected to the first flow path 68 formed on the lower surface of the intermediate electrode plate 60 via a valve 85. Further, on the side wall of the chamber 10, a gas supply pipe 15 is provided. A third gas supply source 86 is connected to the gas supply pipe 15 via a valve 87.

In the plasma processing device 1 of the present embodiment, a primer layer is formed on the substrate W that has been carried into the chamber 10, and then an organic molecular seed layer is formed on the substrate W on which the primer layer is formed.

When a primer layer is formed on the substrate W that has been carried into the chamber 10, first, the plasma processing device 1 controls the valve 84, the valve 85, and the valve 87 to be brought into a closed state, and the gas existing in the chamber 10 is exhausted by the exhaust device 14 until the inside of the chamber 10 reaches a predetermined degree of vacuum. Then, the plasma processing device 1 controls the valve 84 and the valve 85 to be brought into an open state, and operates in the same manner as the plasma processing device 1 described in the first embodiment to form a primer layer on the substrate W. When the formation of the primer layer is completed, the plasma processing device 1 controls the valves 84 and 85 to be brought into a closed state, and the gas existing in the chamber 10 is exhausted by the exhaust device 14.

Next, the plasma processing device 1 controls the valve 87 to be brought into an open state, and supplies a third processing gas from the third gas supply source 86 into the chamber 10 via the gas supply pipe 15. In the present embodiment, the third processing gas is a gasified silane coupling agent. An organic molecular seed layer having a silane coupling link is formed on the substrate W on which the primer layer is formed, by the third processing gas supplied into the chamber 10. In the film forming system 100 of the present embodiment, the formation of the primer layer and the formation of the organic molecular seed layer are performed in the same chamber 10. Thus, it is not necessary to perform a pretreatment before forming the organic molecular seed layer, and it is possible to improve the throughput.

When the formation of the organic molecular seed layer is completed, the plasma processing device 1 controls the valve 87 to be brought into a closed state, and the gas existing in the chamber 10 is exhausted by the exhaust device 14. Then, the substrate W on which the organic molecular seed layer is formed is carried out from the plasma processing device 1.

[MLD Module 200]

Figure 14:
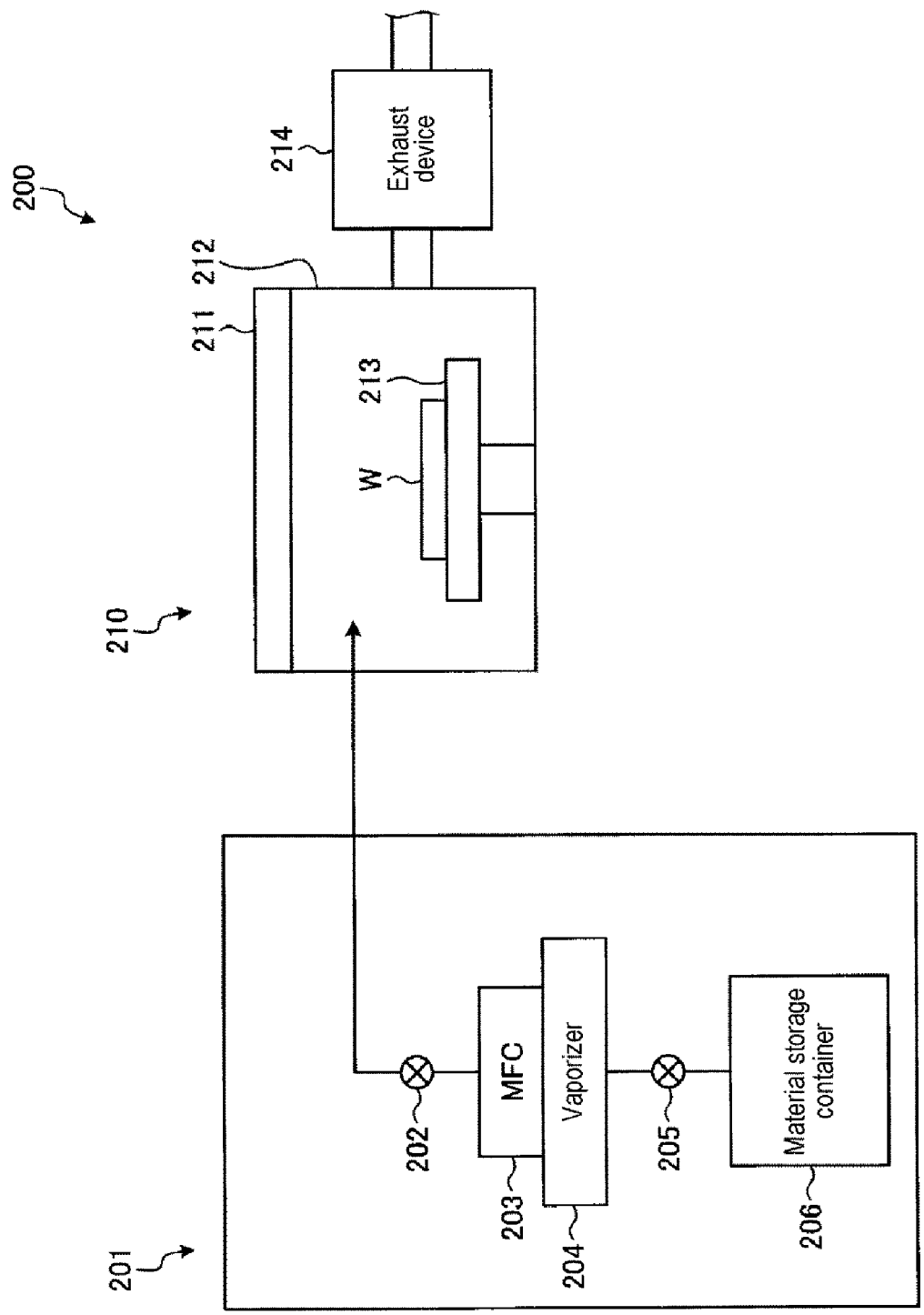
FIG. 14 is a view showing an example of an MLD module.

FIG. 14 is a view showing an example of the MLD module 200. The MLD module 200 includes an organic material gas supply part 201 and a processing chamber 210. The organic material gas supply part 201 includes a valve 202, an MFC 203, a vaporizer 204, a valve 205, and a material storage container 206. A liquid fluorine-containing compound is contained in the material storage container 206. In the present embodiment, the fluorine-containing compound is, for example, a compound containing $CF_x$ and having a molecular structure in a linear chain state.

When the organic material gas is supplied into the processing chamber 210, the valve 202 and the valve 205 are controlled to be brought into an open state, and the liquid fluorine-containing compound in the material storage container 206 is gasified by the vaporizer 204. Then, the gas of the fluorine-containing compound gasified by the vaporizer 204 is controlled in flow rate by the MFC 203 and is supplied into the processing chamber 210.

The processing chamber 210 includes an activation mechanism 211, a processing container 212, a susceptor 213, and an exhaust device 214. The substrate W on which the organic molecular seed layer is formed is mounted on the susceptor 213. The activation mechanism 211 activates functional groups at distal ends of the linear-chain molecules contained in the organic molecular seed layer or the antifouling layer. In the present embodiment, the activation mechanism 211 is, for example, a plasma generation mechanism for generating hydrogen plasma. Alternatively, the activation mechanism 211 may be a UV irradiation mechanism, a heating mechanism, or the like. The heating mechanism may be provided in the susceptor 213. Alternatively, the functional groups at the distal ends of the linear-chain molecules contained in the organic molecular seed layer or the antifouling layer may be activated by supplying a reactive gas into the processing container 212, instead of using the activation mechanism 211. The gas existing in the processing container 212 is exhausted by an exhaust device 214 such as a turbo molecular pump or the like.

After activating the functional groups at the distal ends of the linear-chain molecules contained in the organic molecular seed layer or the antifouling layer on the surface of the substrate W, an organic material gas is supplied from the organic material gas supply part 201 into the processing container 212. The functional groups activated on the surface of the substrate W are terminated by the linear-chain molecules contained in the organic material gas supplied from the organic material gas supply part 201. As a result, the linear-chain molecules contained in the organic material gas supplied from the organic material gas supply part 201 are stacked on the substrate W by one layer. Hereinafter, the layer formed by the linear-chain molecules of a fluorine-containing compound will be referred to as an antifouling layer in some cases.

Thereafter, in the processing chamber 210, the process of activating the functional groups at the distal ends of the linear-chain molecules and the process of terminating the activated functional groups with the linear-chain molecules contained in the organic material gas are repeated until the layer of the linear-chain molecules stacked on the substrate W reaches a predetermined thickness.

[Film Forming Process]

Figure 15:
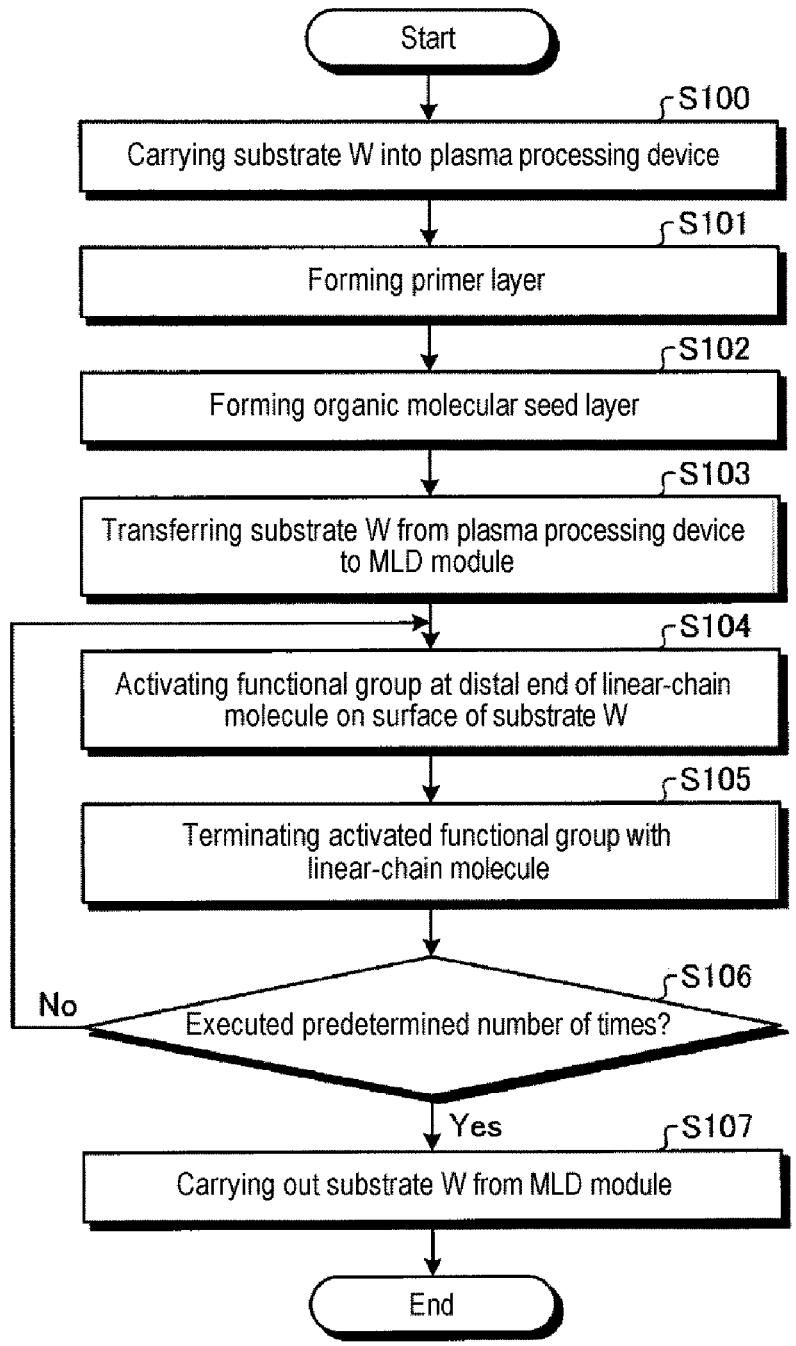
FIG. 15 is a flowchart showing an example of a film forming process performed by the film forming system.

FIG. 15 is a flowchart showing an example of a film forming process performed by the film forming system 100.

First, an unprocessed substrate W is taken out from the load lock chamber 102 by the transfer device in the transfer module 101 and is carried into the plasma processing device 1 (S100). The plasma processing device 1 forms a primer layer on the surface of the substrate W by executing the process described in the first embodiment with respect to the substrate W carried into the plasma processing device 1 (S101).

Figure 16:
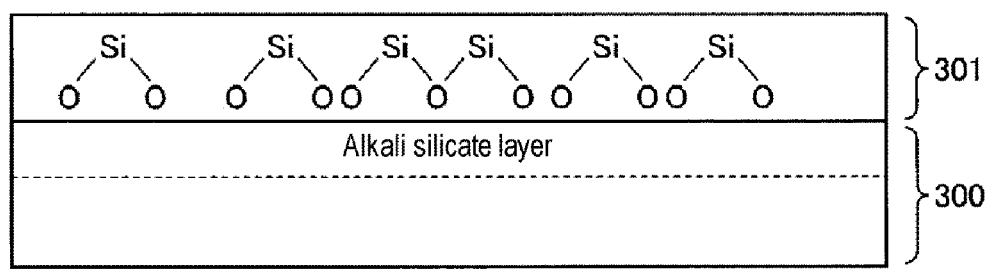
FIG. 16 is a schematic view for explaining an example of a substrate on which a primer layer is laminated.

In the present embodiment, the substrate W is a chemically strengthened glass having an alkali silicate layer formed on its surface. By performing the process shown in step S101, for example, as shown in FIG. 16, a primer layer 301 is formed on the surface of a chemically strengthened glass 300 on which an alkali silicate layer is formed.

Figure 17:
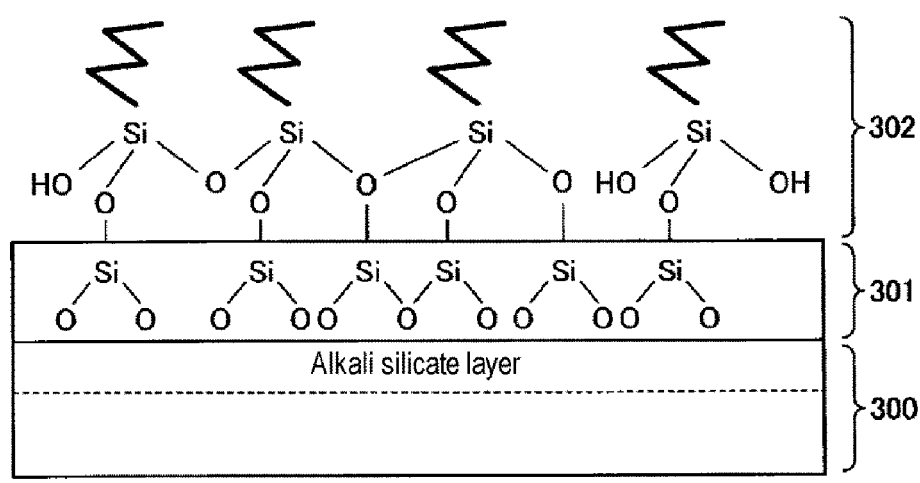
FIG. 17 is a schematic view for explaining an example of a substrate on which an organic molecular seed layer is laminated.

Next, the valve 84 and the valve 85 of the plasma processing device 1 are controlled to be brought into a closed state, and the gas existing inside the chamber 10 is exhausted by the exhaust device 14. Then, the valve 87 is controlled to be brought into an open state, and the third processing gas from the third gas supply source 86 is supplied into the chamber 10. As a result, for example, as shown in FIG. 17, an organic molecular seed layer 302 having a silane coupling link is formed on the primer layer 301 (S102).

Subsequently, the substrate W on which the primer layer and the organic molecular seed layer are formed is carried out from the plasma processing device 1 by the transfer device in the transfer module 101 and is transferred into the MLD module 200 (S103). The MLD module 200 activates the functional groups at the distal ends of the linear-chain-state molecules contained in the organic molecular seed layer using the activation mechanism 211 (S104).

Figure 18:
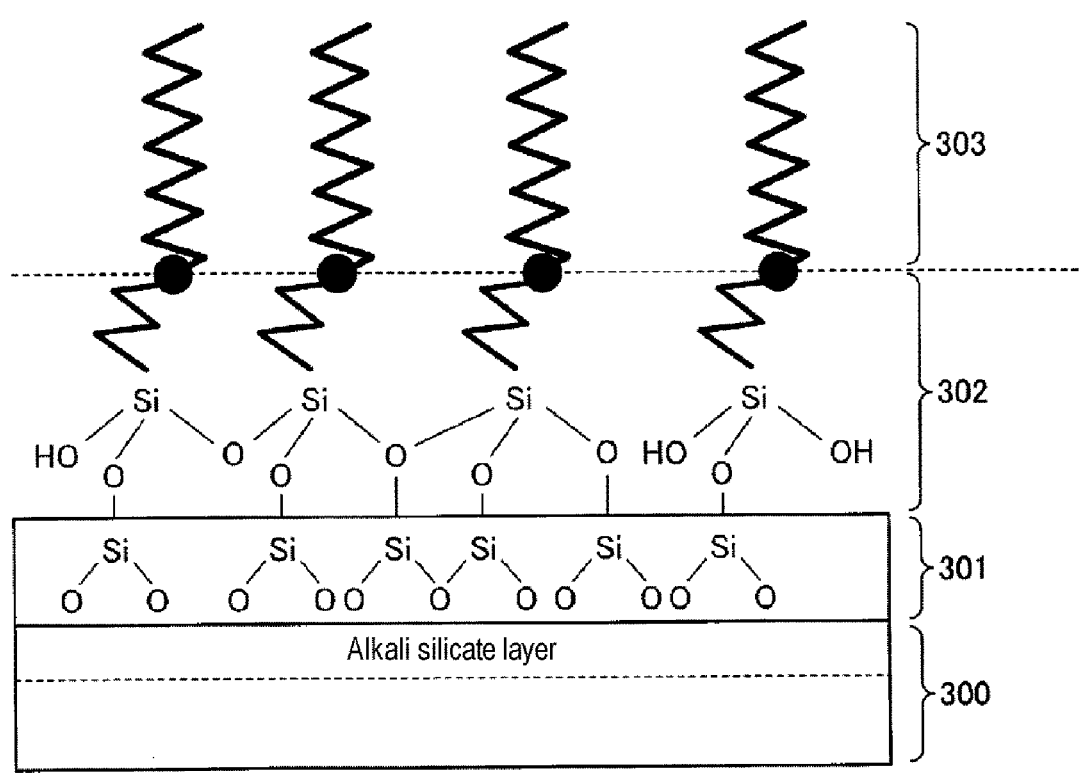
FIG. 18 is a schematic view for explaining an example of a substrate on which one antifouling layer is laminated.

Next, the MLD module 200 supplies an organic material gas of a fluorine-containing compound from the organic material gas supply part 201 into the processing container 212. The functional groups activated on the surface of the substrate W are terminated by the linear-chain-state molecules contained in the organic material gas supplied from the organic material gas supply part 201 (S105). As a result, for example, as shown in FIG. 18, an antifouling layer 303 for one layer is stacked by the linear-chain-state molecules.

Figure 19:
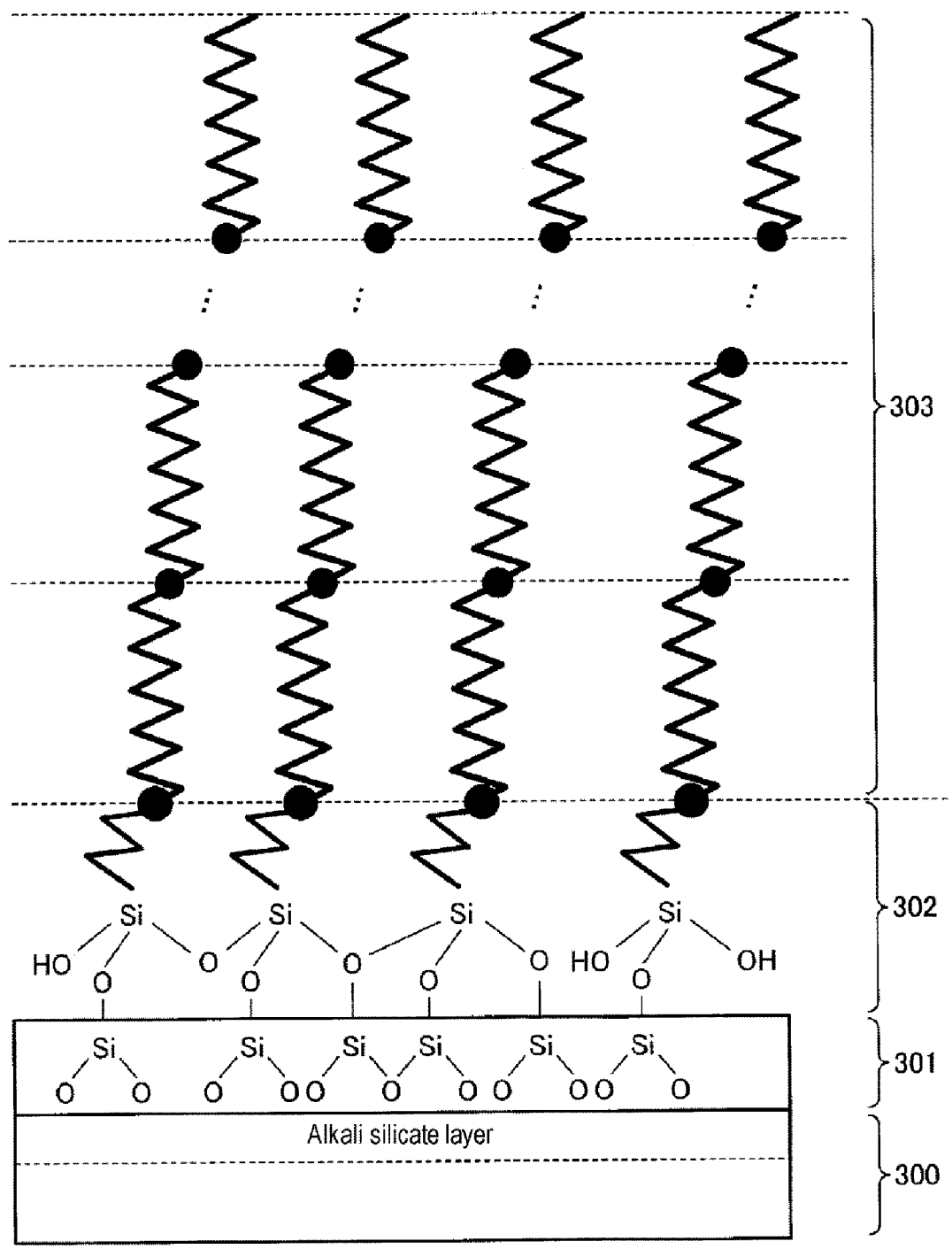
FIG. 19 is a schematic view for explaining an example of a substrate on which a predetermined number of antifouling layers are laminated.

Then, it is determined whether the processing in steps S104 and S105 has been executed a predetermined number of times (S106). When the processing of steps S104 and S105 has not been executed the predetermined number of times (S106: No), the processing shown in step S104 is executed again. On the other hand, when the processing of steps S104 and S105 has been executed the predetermined number of times (S106: Yes), the processed substrate W is unloaded from the MLD module 200 by the transfer device in the transfer module 101 (S107). Thus, the film forming process shown in the flowchart is completed. When the processing in steps S104 and S105 is executed the predetermined number of times, for example, as shown in FIG. 19, the antifouling layer 303 in which a predetermined number of layers of the linear-chain molecules are stacked is formed on the substrate W.

EXPLANATION OF REFERENCE NUMERALS

S1: first space, S2: second space, W: substrate, 1: plasma processing device, 10: chamber, 30: plasma electrode, 32: upper insulating plate, 40: ground plate, 50: intermediate insulating plate, 60: intermediate electrode plate, 61: protrusion, 70: upper electrode plate, 80: first gas supply source, 81: second gas supply source, 86: third gas supply source, 100: film forming system, 200: MLD module, 201: organic material gas supply part, 210: processing chamber, 300: chemically strengthened glass, 301: primer layer, 302: organic molecular seed layer, 303: antifouling layer

What is claimed is:

1. A plasma electrode, comprising:
a first electrode plate having a plurality of cylindrical protrusions and to which high frequency power is applied;
a ground plate provided with a plurality of cylindrical first through holes having an inner diameter larger than an outer diameter of the protrusions; and
an insulating plate provided with a plurality of cylindrical second through holes having an inner diameter larger than the outer diameter of the protrusions and disposed between the first electrode plate and the ground plate,
wherein the first electrode plate, the insulating plate, and the ground plate are overlappingly arranged so that the protrusions are arranged inside the first through holes and the second through holes,
a third through hole is provided in each of the protrusions along a center axis of each of the protrusions,
a first flow path is provided between the first electrode plate and the insulating plate,
a second flow path communicating with the first flow path is provided around the protrusions,
a fourth through hole is provided in the ground plate around each of the first through holes,
one of the third through hole and the fourth through hole discharges a first processing gas to below the ground plate,
the other of the third through hole and the fourth through hole exhausts a gas existing below the ground plate,
the second flow path communicates with a gap formed between outer walls of the protrusions and inner walls of the first through holes, and supplies a second processing gas supplied via the first flow path to the gap, the second processing gas supplied to the gap is converted into plasma in the gap by the high frequency power applied to the first electrode plate,
the third through hole discharges the first processing gas to below the ground plate,
the fourth through hole exhausts the gas existing below the ground plate, and
the fourth through hole has a center axis arranged at a position equidistant from center axes of three adjacent third through holes in the ground plate.

2. The plasma electrode of claim 1, wherein the first electrode plate, the insulating plate, and the ground plate are overlappingly arranged such that the center axis of each of the protrusions of the first electrode plate, a center axis of each of the first through holes, and a center axis of each of the second through holes are aligned with one another.

3. The plasma electrode of claim 1, wherein the second flow path is a gap formed between the outer walls of the protrusions and inner walls of the second through holes.

4. The plasma electrode of claim 3, wherein the first flow path is provided around each of the protrusions on a surface of the first electrode plate on which the protrusions are provided, and
the second flow path is narrower in width than the first flow path provided around the protrusions.

5. The plasma electrode of claim 1, wherein the second flow path is a plurality of fifth through holes provided around the protrusions.

6. The plasma electrode of claim 5, wherein the first flow path is provided around the protrusions on a surface of the first electrode plate on which the protrusions are provided, and
an inner diameter of an opening of each of the fifth through holes is narrower than a width of the first flow path provided around the protrusions.

7. The plasma electrode of claim 1, further comprising:
a second electrode plate provided on a surface of the first electrode plate opposite to a surface of the first electrode plate facing the insulating plate,
wherein a third flow path communicating with the third through hole is provided between the first electrode plate and the second electrode plate.

8. The plasma electrode of claim 7, wherein the first flow path extends in a first direction in a plane parallel to a lower surface of the first electrode plate,
the third flow path extends in a second direction differing from the first direction in the plane parallel to the lower surface of the first electrode plate,
the first direction of the first flow path and the second direction of the third flow path intersect at a center axis of the third through hole when projected onto the plane parallel to the lower surface of the first electrode plate.

9. The plasma electrode of claim 7, wherein the first electrode plate or the second electrode plate is provided with a first groove serving as the third flow path, and
the first electrode plate and the second electrode plate are in contact with each other on a surface other than the first groove.

10. A plasma processing device, comprising:
a chamber;
a mounting table disposed in the chamber and configured to hold a substrate to be processed; and
a plasma electrode provided above the chamber so as to face the mounting table,
wherein the plasma electrode includes a first electrode plate having a plurality of cylindrical protrusions and to which high frequency power is applied, a ground plate provided with a plurality of cylindrical first through holes having an inner diameter larger than an outer diameter of the protrusions, and an insulating plate provided with a plurality of cylindrical second through holes having an inner diameter larger than the outer diameter of the protrusions and disposed between the first electrode plate and the ground plate, the first electrode plate, the insulating plate, and the ground plate are overlappingly arranged so that the protrusions are arranged inside the first through holes and the second through holes, a third through hole is provided in each of the protrusions along a center axis of each of the protrusions, a first flow path is provided between the first electrode plate and the insulating plate, a second flow path communicating with the first flow path is provided around the protrusions, a fourth through hole is provided in the ground plate around each of the first through holes, one of the third through hole and the fourth through hole discharges a first processing gas to below the ground plate, the other of the third through hole and the fourth through hole exhausts a gas existing below the ground plate, the second flow path communicates with a gap formed between outer walls of the protrusions and inner walls of the first through holes, and supplies a second processing gas supplied via the first flow path to the gap, the second processing gas supplied to the gap is converted into plasma in the gap by the high frequency power applied to the first electrode plate, the third through hole discharges the first processing gas to below the ground plate, the fourth through hole exhausts the gas existing below the ground plate, and the fourth through hole has a center axis arranged at a position equidistant from center axes of three adjacent third through holes in the ground plate.

\* \* \* \* \*